(12) United States Patent
Salowe et al.

(10) Patent No.: US 9,817,941 B2
(45) Date of Patent: Nov. 14, 2017

(54) METHODS, SYSTEMS, AND ARTICLES OF MANUFACTURE FOR IMPLEMENTING HIGH CURRENT CARRYING INTERCONNECTS IN ELECTRONIC DESIGNS

(71) Applicant: Cadence Design Systems, Inc., San Jose, CA (US)

(72) Inventors: Jeffrey S. Salowe, Los Gatos, CA (US); Satish Raj, Saratoga, CA (US); Mark Edward Rossman, Bellevue, WA (US)

(73) Assignee: Cadence Design Systems, Inc., San Jose, CA (US)

( * ) Notice: Subject to any disclaimer, the term of this patent is extended or adjusted under 35 U.S.C. 154(b) by 436 days.

(21) Appl. No.: 14/483,060

(22) Filed: Sep. 10, 2014

(65) Prior Publication Data

US 2016/0070841 A1 Mar. 10, 2016

(51) Int. Cl.
*G06F 9/455* (2006.01)
*G06F 17/50* (2006.01)
*H01L 23/528* (2006.01)

(52) U.S. Cl.
CPC ...... *G06F 17/5077* (2013.01); *G06F 17/5081* (2013.01); *H01L 23/528* (2013.01)

(58) Field of Classification Search
USPC .................................. 716/111, 112, 118, 119
See application file for complete search history.

(56) References Cited

U.S. PATENT DOCUMENTS

| | | | |
|---|---|---|---|
| 4,484,292 | A | 11/1984 | Hong et al. |
| 4,811,237 | A | 3/1989 | Putatunda et al. |
| 5,535,134 | A | 7/1996 | Cohn et al. |
| 5,644,500 | A | 7/1997 | Miura et al. |
| 5,770,481 | A | 6/1998 | Fujii |
| 6,011,912 | A | 1/2000 | Yui et al. |
| 6,298,468 | B1 | 10/2001 | Zhen |
| 6,324,675 | B1 | 11/2001 | Dutta et al. |
| 6,349,403 | B1 | 2/2002 | Dutta et al. |
| 6,407,434 | B1 | 6/2002 | Rostoker et al. |
| 6,490,713 | B2 | 12/2002 | Matsumoto |

(Continued)

OTHER PUBLICATIONS

Dion et al., Contour: A Tile-based Gridless Router, 30 pages, Western Research Laboratory, Mar. 1995.

(Continued)

*Primary Examiner* — Brian Ngo
(74) *Attorney, Agent, or Firm* — Vista IP Law Group, LLP

(57) ABSTRACT

Various embodiments implement additional connectivity for electronic designs by identifying one or more regions for a route in normal connectivity of an electronic design, identifying a plurality of seeding segments from the route based at least in part upon the one or more regions, identifying a plurality of additional nodes in the plurality of seeding segments, and generating one or more additional routes connecting the plurality of additional nodes in the plurality of seeding segments. The one or more additional routes are generated without disturbing the normal connectivity including a plurality of Steiner points and the route. Additional nodes differ from Steiner points and are used to implement additional routes that belong to a different route type.

20 Claims, 20 Drawing Sheets

(56) References Cited

U.S. PATENT DOCUMENTS

| | | |
|---|---|---|
| 6,505,333 B1 | 1/2003 | Tanaka |
| 6,543,041 B1 | 4/2003 | Scheffer et al. |
| 6,557,145 B2 | 4/2003 | Boyle et al. |
| 6,763,512 B2 | 7/2004 | Xing |
| 6,769,105 B1 | 7/2004 | Teig et al. |
| 6,813,755 B2 | 11/2004 | Xing |
| 6,851,100 B1 | 2/2005 | You et al. |
| 6,892,371 B1 | 5/2005 | Teig et al. |
| 6,938,234 B1 | 8/2005 | Teig et al. |
| 6,957,407 B2 | 10/2005 | Suto |
| 6,957,411 B1 | 10/2005 | Teig et al. |
| 6,981,235 B1 | 12/2005 | Salowe et al. |
| 6,996,512 B2 | 2/2006 | Alpert et al. |
| 7,016,794 B2 | 3/2006 | Schultz |
| 7,051,313 B1 | 5/2006 | Betz et al. |
| 7,076,750 B1 | 7/2006 | Lukanc |
| 7,089,526 B1 | 8/2006 | Salowe et al. |
| 7,096,445 B1 | 8/2006 | Pucci et al. |
| 7,100,128 B1 | 8/2006 | Nequist et al. |
| 7,107,564 B1 | 9/2006 | Teig et al. |
| 7,117,468 B1 | 10/2006 | Teig et al. |
| 7,222,322 B1 | 5/2007 | Chyan et al. |
| 7,257,797 B1 | 8/2007 | Waller et al. |
| 7,363,607 B2 | 4/2008 | Birch et al. |
| 7,506,289 B1 * | 3/2009 | Chapman .......... G06F 17/5077 716/126 |
| 7,516,433 B1 | 4/2009 | Pucci et al. |
| 7,523,430 B1 | 4/2009 | Patel |
| 7,594,214 B1 | 9/2009 | Salowe et al. |
| 7,694,261 B1 | 4/2010 | Chyan et al. |
| 7,752,590 B1 | 7/2010 | Chyan et al. |
| 7,802,208 B1 | 9/2010 | Waller et al. |
| 7,890,909 B2 | 2/2011 | Pyapali et al. |
| 7,934,177 B2 | 4/2011 | Shin |
| 7,958,480 B1 | 6/2011 | Slonim et al. |
| 8,006,216 B1 | 8/2011 | Chen et al. |
| 8,028,253 B2 | 9/2011 | Drapeau |
| 8,239,806 B2 | 8/2012 | Chen et al. |
| 8,375,348 B1 | 2/2013 | Raj et al. |
| 8,418,110 B2 | 4/2013 | Keinert et al. |
| 8,479,141 B1 | 7/2013 | Waller et al. |
| 8,495,549 B2 | 7/2013 | Maruyama et al. |
| 8,510,703 B1 | 8/2013 | Wadland et al. |
| 8,560,998 B1 | 10/2013 | Salowe et al. |
| 8,671,368 B1 | 3/2014 | Salowe et al. |
| 8,769,455 B1 | 7/2014 | Singh et al. |
| 9,183,343 B1 | 11/2015 | Salowe et al. |
| 2001/0038612 A1 | 11/2001 | Vaughn |
| 2003/0014201 A1 | 1/2003 | Schultz |
| 2003/0126578 A1 | 7/2003 | Wadland et al. |
| 2006/0288323 A1 | 12/2006 | Birch |
| 2007/0101303 A1 | 5/2007 | Lien |
| 2007/0106969 A1 | 5/2007 | Birch et al. |
| 2007/0162884 A1 | 7/2007 | Matsuno et al. |
| 2008/0072182 A1 | 3/2008 | He et al. |
| 2008/0244504 A1 | 10/2008 | Drapeau |
| 2009/0055792 A1 | 2/2009 | Itagaki |
| 2009/0144688 A1 | 6/2009 | Uchino et al. |
| 2009/0172628 A1 | 7/2009 | Chyan |
| 2010/0037200 A1 | 2/2010 | Ghan |
| 2010/0106274 A1 | 4/2010 | Konno et al. |
| 2010/0115479 A1 | 5/2010 | Hatano et al. |
| 2010/0122228 A1 | 5/2010 | McCracken et al. |
| 2010/0199253 A1 | 8/2010 | Cheng et al. |
| 2011/0014786 A1 | 1/2011 | Sezginer |
| 2011/0119648 A1 | 5/2011 | Chen et al. |
| 2011/0185329 A1 | 7/2011 | Wen et al. |
| 2011/0219341 A1 | 9/2011 | Cao et al. |
| 2011/0260318 A1 | 10/2011 | Eisenstadt |
| 2011/0296360 A1 | 12/2011 | Wang et al. |
| 2012/0079442 A1 | 3/2012 | Akar et al. |
| 2012/0131528 A1 | 5/2012 | Chen et al. |
| 2013/0019220 A1 | 1/2013 | Maruyama et al. |
| 2013/0036396 A1 | 2/2013 | Arayama et al. |
| 2013/0086543 A1 | 4/2013 | Agarwal et al. |
| 2013/0086545 A1 | 4/2013 | Alpert et al. |
| 2013/0155555 A1 | 6/2013 | Blanc et al. |
| 2013/0159965 A1 | 6/2013 | Karatal et al. |
| 2015/0193573 A1 * | 7/2015 | Tung .................. G03F 7/70441 716/53 |

OTHER PUBLICATIONS

Hwang, Chanseok, and Massoud Pedram. "Interconnect design methods for memory design." Proceedings of the 2004 Asia and South Pacific Design Automation Conference. IEEE Press, 2004.

Jeffrey Salowe, "Gridding for Advanced Process Nodes" 2012.

Lin, I-Jye, Tsui-Yee Ling, and Yao-Wen Chang. "Statistical circuit optimization considering device andinterconnect process variations." Proceedings of the 2007 international workshop on System level interconnect prediction. ACM, 2007.

Ou, Hung-Chih, Hsing-Chih Chang Chien, and Yao-Wen Chang. "Simultaneous analog placement and routing with current flow and current density considerations." Proceedings of the 50th Annual Design Automation Conference. ACM, 2013.

Pompl, T., et al. "Practical aspects of reliability analysis for IC designs." Proceedings of the 43rd annual Design Automation Conference. ACM, 2006.

Singh, Jaskirat, and Sachin S. Sapatnekar. "Topology optimization of structured power/ground networks." Proceedings of the 2004 international symposium on Physical design. ACM, 2004.

Wang, Laung-Terng, Charles E. Stroud, and Nur A. Touba. System-on-chip test architectures: nanometer design for testability. Morgan Kaufmann, 2010.

"Li et al., "NEMO: A New Implicit-Connection Graph-Based Gridless Router With Multilayer Planes and Pseudo Tile Propagation," IEEE Trans. on CAD of ICs & Systems, vol. 26, No. 4 Apr. 2007, pp. 705-718.".

"Lin et al., "Double Patterning Lithography Aware Grid less Detailed Routing with Innovative Conflict Graph," DAC'1 0, Jun. 13-18, 2010, pp. 398-403."

Cho et al., "Double Patterning Technology Friendly Detailed Routing", IEEE/ACM International Conference, 2008, pp. 506-511.

Hsu et al., "Template-Mask Design Methodology for Double Patterning Technology," 2010 IEEE, pp. 107-111.

U.S. Appl. No. 13/602,069, filed Aug. 31, 2012.
U.S. Appl. No. 13/602,071, filed Aug. 31, 2012.
U.S. Appl. No. 13/692,970, filed Dec. 3, 2012.
U.S. Appl. No. 13/705,164, filed Dec. 4, 2012.

* cited by examiner

METHODS, SYSTEMS, AND ARTICLES OF MANUFACTURE FOR IMPLEMENTING HIGH CURRENT CARRYING INTERCONNECTS IN ELECTRONIC DESIGNS

CROSS-REFERENCE TO RELATED APPLICATION(S)

This Application is related to U.S. patent application Ser. No. 13/705,164 filed on Dec. 4, 2012 and entitled "METHODS, SYSTEMS, AND ARTICLES OF MANUFACTURE FOR IMPLEMENTING HIGH CURRENT CARRYING INTERCONNECTS IN ELECTRONIC DESIGNS". The content of the aforementioned U.S. patent applications is hereby incorporated by reference in its entirety for all purposes.

BACKGROUND

Integrated circuits, or ICs, are created by patterning a substrate and materials deposited on the substrate. The substrate is typically a semiconductor wafer. The patterned features make up devices and interconnections. This process generally starts with a designer creating an integrated circuit by hierarchically defining functional components of the circuit using a hardware description language. From this high-level functional description, a physical circuit implementation dataset is created, which is usually in the form of a netlist. This netlist identifies logic cell instances from a cell library, and describes cell-to-cell connectivity.

Many phases of these electronic design activities may be performed with computer aided design (CAD) tools or electronic design automation (EDA) systems. For example, an integrated circuit designer may use a set of layout EDA application programs, such as behavior and logic synthesis tools, a floor planning tool, a placement tool, a router, a layout editor, or a post-route optimizer to create, modify, and/or optimize integrated circuit designs.

The task of all routers is the same—routers are given some pre-existing polygons consisting of pins, terminals, or pads on cells and optionally some pre-routes from the placers to create global routes, conduit routes, or detail routes so that all pins assigned to different nets are connected by wires and vias, that all wires and vias assigned to different nets do not overlap, and that all design rules are obeyed. That is, a router fails when two pins on the same net that should be connected are open, when two pins on two different nets that should remain open are shorted, or when some design rules are violated during routing. A router is thus expected to connect two points with a single wire for all but some special nets such as the power net, the ground net, the clock net, nets for busses, spine routes connecting multiple pins to the trunk of a spine, or multi-strand nets for carrying high or higher current.

Conventional routers (global router, conduit router, channel router, and detail router) identify various pins, pads, and terminals that must be interconnected and introduce various Steiner points to solve a rectilinear minimum spanning tree problem in order to find the respective global, conduit, channel, and detail routes. These approaches may attempt to add redundant connections or multiple connections with redundant vias, double-cut vias, bar vias, etc. by introducing additional Steiner points. Although these approach may achieve their intended purposes for conventional electronic designs, these approaches may nevertheless fail when processing modern electronic designs with 14-nm or smaller advanced nodes due to insufficient routing resources, especially in multiple-patterning terms, that have rendered larger vias far less favorable. Moreover, the introduction of additional Steiner points in implementing a route disturbs the original connectivity because a Steiner point breaks the original route on which the Steiner point lies. Some other conventional approaches rely on remastering techniques for reducing feature sizes on lithography. Recent research has found evidence showing that the remastering process may not even achieve its intended purposes in advanced nodes having 14-nm or smaller advanced nodes.

Therefore, there exists a need for a method, a system, and an article of manufacture for implementing additional connectivity for electronic designs.

SUMMARY

Disclosed are method(s), system(s), and article(s) of manufacture for implementing additional connectivity for electronic designs in one or more embodiments. Some embodiments are directed at a method for implementing additional connectivity for electronic designs. The method includes the acts of identifying one or more regions for a route in normal connectivity of an electronic design, identifying a plurality of seeding segments from the route based at least in part upon the one or more regions, and generating one or more additional routes connecting the plurality of additional nodes in the plurality of seeding segments. In some embodiments, the method may further include the acts of identifying the plurality of additional nodes in the plurality of seeding segments, and incorporating the plurality of additional nodes and the one or more additional routes into additional connectivity that is different from the normal connectivity.

In addition or in the alternative, the one or more additional routes are generated without disturbing the normal connectivity that includes a plurality of Steiner points and the route. In some embodiments, the method may further include the act of identifying one or more design rules, wherein the act of identifying the one or more regions is performed based at least in part upon the one or more design rules, and the one or more seeding segments are determined by subtracting the one or more regions from a first geometric entity including the route. In addition or in the alternative, the method may include the act of searching for connectivity for a viable routing solution using a search probe or a search strategy when the search probe or the search strategy encounters a first additional node of the plurality of additional nodes instead of looking up the connectivity in a data structure, wherein the connectivity for the viable routing solution does not alter the normal connectivity including the route.

In some of these embodiments, the method may further include the act of determining a final location of a first additional node of the plurality of additional nodes based at least in part upon results of searching for the connectivity. In addition, the method may further include the acts of identifying a normal connectivity iterator for manipulating the normal connectivity, and identifying an additional connectivity iterator for manipulating the additional connectivity, wherein the normal connectivity iterator maintains the normal connectivity and ignores or does not have access to the additional connectivity, the additional connectivity iterator maintains the additional connectivity and is allowed to access both the normal connectivity and the additional connectivity, and the act of searching for the connectivity is performed by using at least the additional connectivity iterator. In some embodiments, the method may include the act of designating the one or more regions as keep-out area to remove the one or more regions from routing resource that is used to implement the one or more additional routes.

In addition or in the alternative, the method may include the acts of determining whether or not wrong-way routing is permitted in at least a portion of the electronic design including the plurality of additional routes, determining whether or not spacetiles are used to implement at least one of the plurality of additional routes, and determining a route type for the plurality of additional routes, wherein the route is not of the new route type. In some embodiments, the method may further include the act of determining whether at least one additional node of the plurality of the one or more additional nodes is to be removed based at least in part upon one or more rules, wherein the at least one additional node is to be removed by an additional connectivity iterator associated with the additional connectivity but not by a normal connectivity iterator associated with the normal connectivity, and determining whether an additional node of the plurality of the one or more additional nodes is redundant by using the additional connectivity iterator and not by using the normal connectivity iterator. In addition or in the alternative, the method may further include the act of designating the one or more regions as keep-out area to remove the one or more regions from routing resource that is used to implement the one or more additional routes.

In addition or in the alternative, the method may include the acts of determining whether a Steiner point is allowed in the additional connectivity, and adding a first route connecting to the Steiner point to the additional connectivity when the Steiner point is determined to be allowed in the additional connectivity. Optionally, the method may include at least one of the acts of labeling some but not all of additional routes in the additional connectivity, adding a purpose for the additional connectivity, grouping the additional connectivity into a selection set for one or more additional operations, verifying a net in the electronic design by using a search strategy while ignoring the additional connectivity, determining whether one or more additional nodes of the plurality of additional nodes for the additional connectivity are redundant in the electronic design based at least in part upon the route, generating and using a first class of objects for the additional connectivity to guide one or more electronic design automation tools, and generating and using a second class of objects for temporarily blocking the one or more regions to implement the additional connectivity. In some of the embodiments, the method may optionally include the acts of identifying a global or conduit route in the electronic design, identifying one or more global additional nodes for the global or conduit route, and updating the additional connectivity to incorporate the one or more global additional nodes.

Some embodiments are directed at a hardware system that may be invoked to perform any of the methods, processes, or sub-processes disclosed herein. The hardware system may include at least one processor or at least one processor core, which executes one or more threads of execution to perform any of the methods, processes, or sub-processes disclosed herein in some embodiments. The hardware system may further include one or more forms of non-transitory machine-readable storage media or devices to temporarily or persistently store various types of data or information. Some exemplary modules or components of the hardware system may be found in the System Architecture Overview section below.

Some embodiments are directed at an article of manufacture that includes a non-transitory machine-accessible storage medium having stored thereupon a sequence of instructions which, when executed by at least one processor or at least one processor core, causes the at least one processor or the at least one processor core to perform any of the methods, processes, or sub-processes disclosed herein. Some exemplary forms of the non-transitory machine-readable storage media may also be found in the System Architecture Overview section below.

BRIEF DESCRIPTION OF THE DRAWINGS

The drawings illustrate the design and utility of various embodiments of the invention. It should be noted that the figures are not drawn to scale and that elements of similar structures or functions are represented by like reference numerals throughout the figures. In order to better appreciate how to obtain the above-recited and other advantages and objects of various embodiments of the invention, a more detailed description of the present inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION

Various embodiments of the invention are directed to a methods, systems, and articles of manufacture for implementing additional connectivity for electronic designs.

Other objects, features, and advantages of the invention are described in the detailed description, figures, and claims.

Various embodiments will now be described in detail with reference to the drawings, which are provided as illustrative examples of the invention so as to enable those skilled in the art to practice the invention. Notably, the figures and the examples below are not meant to limit the scope of the present invention. Where certain elements of the present invention may be partially or fully implemented using known components (or methods or processes), only those portions of such known components (or methods or processes) that are necessary for an understanding of the present invention will be described, and the detailed descriptions of other portions of such known components (or methods or processes) will be omitted so as not to obscure the invention. Further, various embodiments encompass present and future known equivalents to the components referred to herein by way of illustration.

Figure 1:
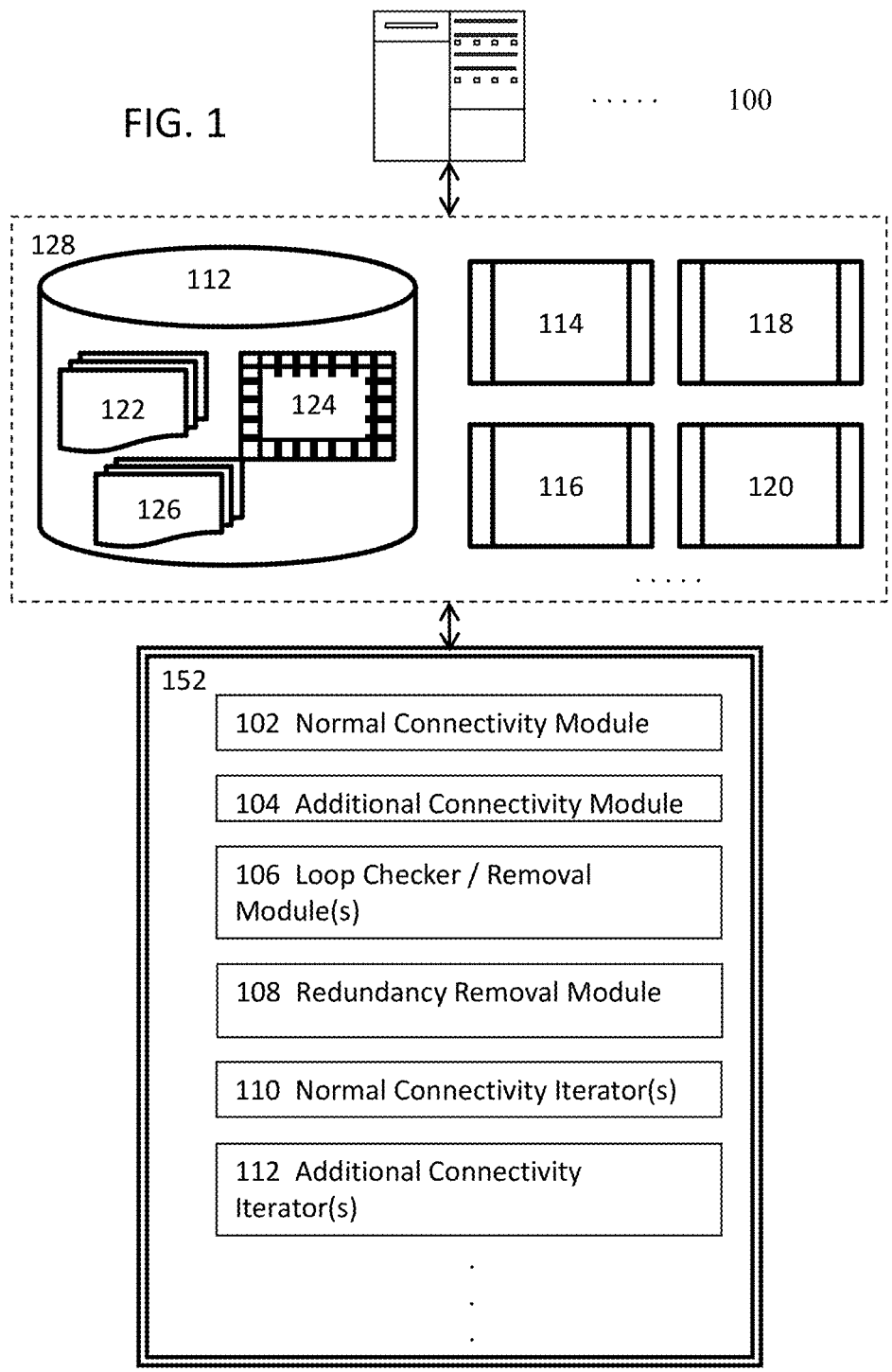
FIG. 1 illustrates a high level block diagram for a system for implementing additional connectivity for electronic designs in some embodiments.

Disclosed are method(s), system(s), and article(s) of manufacture for implementing additional connectivity for electronic designs in one or more embodiments. Various details of any of the processes, sub-processes, or acts are further provided below with reference to respective drawing figures. FIG. 1 illustrates a high level block diagram for a method or a system for implementing additional connectivity for electronic designs in some embodiments. In one or more embodiments, the system for implementing additional connectivity for electronic designs may comprise one or more computing systems 100, such as a general purpose computer described in the System Architecture Overview section to implement one or more special proposes.

In some embodiments, the one or more computing systems 100 may invoke various system resources such as the processor(s) or processor core(s), memory, disks, etc. The one or more computing systems 100 may also initiate or interact with other computing systems to access various resources 128 that may comprise a global routing engine, a conduit routing engine (also referred to as C-routing engine or corridor routing engine), and/or a detail routing engine 114, a layout editor 116, a design rule checker 118, a verification engine 120, etc. The one or more computing systems 100 may further write to and read from a local or remote volatile or non-volatile computer accessible storage 112 that stores thereupon data or information such as, but not limited to, one or more databases (124) such as schematic design database(s) or physical design database(s), libraries, data, rule decks, constraints, etc. (122), or other information or data (126) that may be used to facilitate the performance of various functions to achieve the intended purposes.

In some embodiments, conduit-routing is performed between the global and detail routing stages to coordinate assignment for routes that cross one or more cell boundaries which are defined during the global routing stage. In these embodiments, the conduit-routing may determine the major part of a route which crosses multiple cells while leaving mostly short connections within a cell to be routed by the detail router. Conduit routing is distinguishable from channel routing which identifies and defines a channel to be the space along an edge between two wires and determines the possibility or capacity of running one or more wires through the identified channel.

In some embodiments, the one or more computing systems 100 may, either directly or indirectly through various resources 128 to invoke various software, hardware modules or combinations thereof 152 that may comprises a normal connectivity module 102 to access and manage normal connectivity of electronic designs, an additional connectivity module 104 to access and manage additional connectivity of electronic designs, one or more loop checker and/or removal modules 106 to check electronic designs for loops and to remove identified loops either alone or jointly with one or more other modules, one or more redundancy modules 108 to determine whether certain circuit components (e.g., routes) or entities (e.g., additional nodes, Steiner points, etc.) are redundant and/or to remove redundancies, one or more normal connectivity iterators 110 that iterate over all of the entities (e.g., routes, shapes, etc.) these iterator touches within the normal connectivity of electronic designs, and one or more additional connectivity iterators 150 that iterate over all of the entities (e.g., routes, shapes, etc.) these iterator touches within the normal connectivity and the additional connectivity of electronic designs, etc.

The normal connectivity of at least a portion of an electronic design includes the routes (e.g., global routes, c-routes, detail routes, etc.), the pins, pads, or terminals interconnected by the routes in some embodiments. In some of these embodiments, the normal connectivity may further comprise the Steiner points used to implement the routes. The additional connectivity of an electronic design is separate and distinct from the normal connectivity of the same electronic design in that the additional connectivity includes the additional nodes, none of which are the Steiner points used to determine the normal connectivity, and the additional routes (e.g., global routes, c-routes, and/or detail routes) in some embodiments.

An additional node includes an artificially generated point that overlaps a route or an end point (e.g., a pin, a pad, a terminal, etc.) thereof and is used to create an additional route for the route. More details about the additional connectivity and additional node will be described below. In some embodiments, a normal connectivity iterator either ignores the additional connectivity or is not allowed to access the additional connectivity. In contrast, an additional connectivity iterator may access both the normal connectivity and the additional connectivity. An iterator may be used to search for viable routing solutions in some embodiments.

Figure 2:
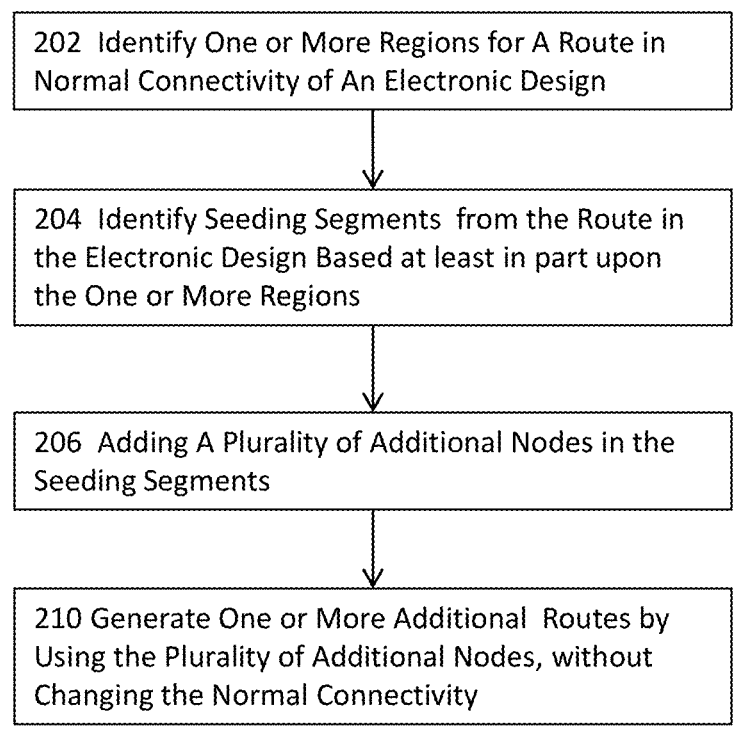
FIG. 2 illustrates a top level flow diagram for implementing additional connectivity for electronic designs in some embodiments.

FIG. 2 illustrates a top level flow diagram for implementing additional connectivity for electronic designs in some embodiments. In these embodiments illustrated in FIG. 2, the method or system may identify one or more regions for a route in normal connectivity of an electronic design at 202. The normal connectivity of at least a portion of an electronic design includes the routes (e.g., global routes, c-routes, detail routes, etc.), the pins, pads, or terminals interconnected by the routes in some embodiments. In some of these embodiments, the normal connectivity may further comprise the Steiner points that are used in a rectilinear minimum spanning tree (or rectilinear Steiner tree) problem to implement the routes.

The connectivity information associated with a Steiner point may be listed in a data structure in some embodiments and thus may be looked up (e.g., from a look-up date or a list) or queried (e.g., from a database) without performing a search. On the other hand. The additional connectivity of an electronic design is separate and distinct from the normal connectivity of the same electronic design in that the additional connectivity includes additional nodes, none of which are the Steiner points used to determine the normal connectivity, and the additional routes (e.g., global routes, c-routes, and/or detail routes) in some embodiments. An additional node may include an artificially generated point that overlaps a route or an end point (e.g., a pin, a pad, a terminal, etc.) thereof and may thus be used to create an additional route for the route in some embodiments.

An additional node may or may not have an exact geometric location in an electronic design, regardless of whether or not the additional node is used to implement any specific types of routes. For example, an addition node that is used to implement a global route or a conduit route does not have a fixed geometric location in the design space because of the nature of the global route or conduit route that does not have a fixed path in the same design space. As another example, an additional node that is used to implement a detail route may still have no fixed location or at least no fixed location before the detail route segment connected to this particular additional node is finalized in the electronic design in some embodiments.

In some embodiments, an additional node is not associated with or does not have the requisite connectivity information to guide the router. In these embodiments, an additional node may serve a function of instructing the router to perform a search (e.g., an area-based search) or shape lookup for connectivity, rather than retrieving the connectivity information from, for example, a connectivity list or a net list as the router does when using a Steiner point to implement routes in normal connectivity. In these embodiments, normal connectivity is explicitly defined by a data structure for a Steiner point, whereas the connectivity for an additional node is not.

Additional connectivity may also be distinguished from normal connectivity in that normal connectivity is fully connected and free of loops, whereas additional connectivity may exhibit loops. In these embodiments, the additional routes in the additional connectivity may be added to electronic designs as a different route type because the loop checking and removing process (e.g., loop checker and remover modules 106 of FIG. 1) may remove some additional routes that were intended to form some loops. In various embodiments, an additional node is further distinguishable from a Steiner point or node in that Steiner points constitute the vertices of the connectivity graph model, and the edges represent the routes, and that an additional node connects explicitly to its route (e.g., an additional route) but implicitly to the shapes in the same physical location in some embodiments.

In these embodiments, the method or system may use additional nodes to implement redundant interconnects, strand routes, bus-like structures, spine routing, etc. without disturbing or altering the normal connectivity. In this respect, an additional node is in sharp contrast with a Steiner point in that a Steiner point, when inserted along a route, always breaks the router because one end of the route will terminate at this inserted Steiner point, whereas an additional node, when inserted along the same route, will not break the route or disturb the normal connectivity including the route.

An additional node may thus be added along a route in the normal connectivity or may overlap a terminal occupying the same physical location without disturbing the normal connectivity as Steiner points will in some embodiments. In this aspect, the method or system may use additional nodes to implement redundant connections, strand routing, or any types of routing where multiple connections between two nodes or two objects are required or desired. An additional node may nonetheless have all the properties of a Steiner point for routing purposes in some embodiments. Additional nodes may even be stored in the same data structure with Steiner points and distinguished from Steiner points by a field in the same data structure in some of these embodiments.

The one or more regions identified at 202 for a route may include one or more areas that will be covered up (e.g., one or more keep-out areas) near the route at least during the implementation of additional routes or additional connectivity. The one or more regions for a route may be identified based at least in part upon one or more design rules. In the working example illustrated in FIG. 10, the method or system may identify the first region 1002 and the second region 1004 based at least in part upon, for example, via cut-to-cut rule (specifying the minimum spacing between two immediately neighboring via cuts) so that the first and second regions 1002 and 1004 may be subsequently covered up during the implementation of additional connectivity to ensure that the additional connectivity automatically satisfies one or more design rules under consideration. In some embodiments where a route includes one or more two-dimensional shapes such as those in a layout, a region may include the area occupied by the route plus additional clearance as controlled by the pertinent design rules.

At 204, the method or system may identify seeding segments from the route in the electronic design based at least in part upon the one or more regions. A seeding segment may be a point on the route, a line segment along the route, or an area surrounding a portion of the route. In some embodiments where the route represents a two-dimensional object in the electronic design, a seeding area may include the difference between the area occupied by the two-dimensional object and the area occupied by the corresponding region that will be covered or subtract from the routing resource at least during the implementation of a portion of the additional connectivity for the route.

At 206, the method or system may add a plurality of additional nodes in the seeding segments identified at 204. In some embodiments, the method or system may add an additional node at a fixed location in a seeding segment in the design space. In some other embodiments, the method or system may add an additional node in an approximate location that may be moved or changed in a seeding segment. In these latter embodiments, the additional node having an approximate location in a seeding segment is used to indicate that the router, when encountering the additional node, is to perform a search for connectivity or search for design components to connect to in order to perform its routing function, rather than looking up connectivity from, for example, a connectivity list that explicitly specifies how design components are connected in at least the pertinent portion of the electronic design. Therefore, the additional node further serves the function of triggering a search for the router in these embodiments.

The final location of an additional node having an approximate location when added at 206 will be determined and thus fixed based at least in part upon one or more design rules that govern how the one or more additional routes connecting the additional node are implemented in the electronic design. In some embodiments where spacetiles are used to guide the router to find viable routing solutions, the method or system may further transfer the information about the plurality of additional nodes to the spacetile engine such that the spacetile engine may punch the design space with at least one of the plurality of additional nodes to form spacetiles that may be used to guide the router to find routing solutions.

At 208, the method or system may generate one or more additional routes for the route of interest identified at 202 by using the plurality of additional nodes added at 206. In some of these embodiments, the method or system may generate these one or more additional routes and update the additional connectivity with, for example, the one or more additional routes or segments thereof, the plurality of additional nodes, how the plurality of additional nodes are connected by the one or more additional routes. In addition or in the alternative, the method or system may generate the one or more additional routes without changing the normal connectivity including the route of interest identified at 202, various nodes (e.g., pins, pads, terminals, etc.) in the electronic design, and the Steiner points and corresponding circuit components (e.g., vias) added in addition to the various nodes to furnish the route.

Figure 3:
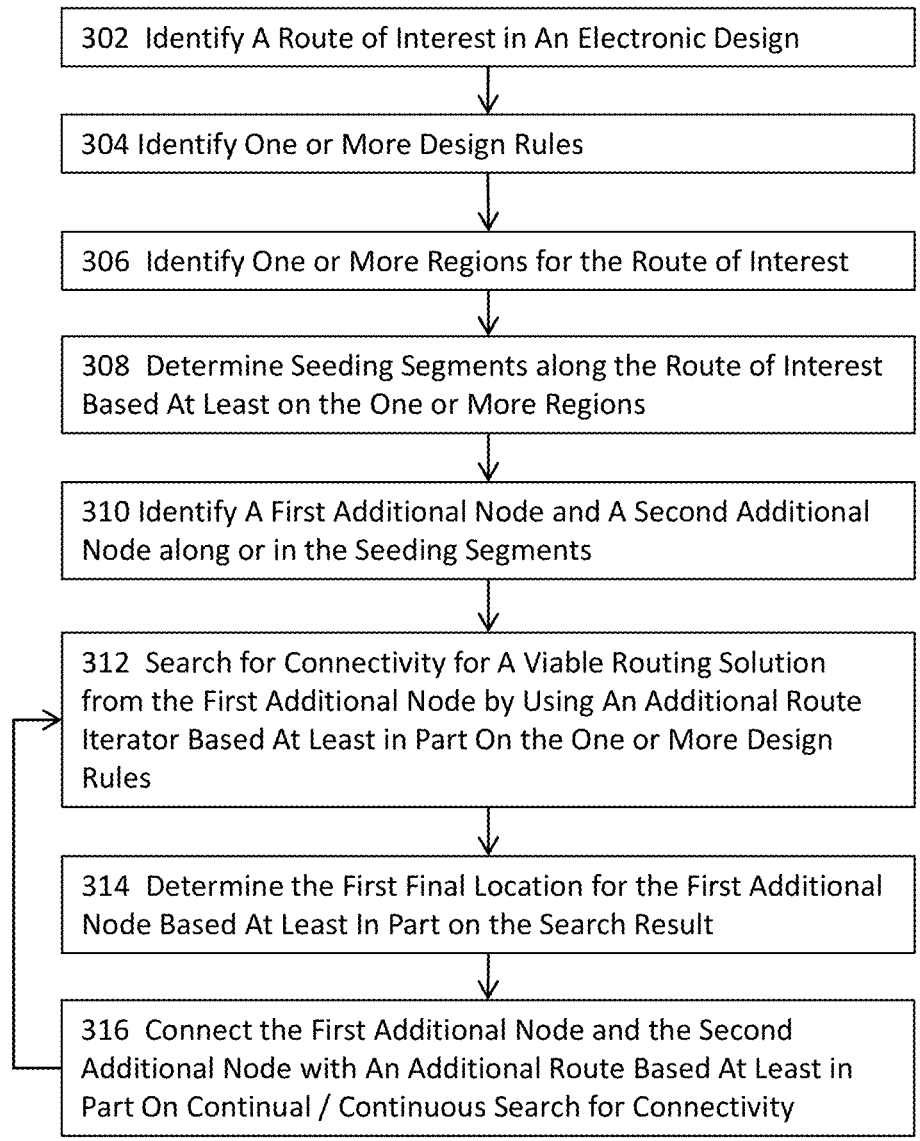
FIG. 3 illustrates a more detailed flow diagram for implementing additional connectivity for electronic designs in some embodiments.

FIG. 3 illustrates a more detailed flow diagram for implementing additional connectivity for electronic designs in some embodiments. In these embodiments illustrated in FIG. 3, the method or system may identify a route of interest in an electronic design at 302. For example, a route of interest may include one that is considered important or critical and thus needs one or more redundant connections to render the route fail safe. A route of interest may also include one that includes a single-cut via, but a double-cut or a bar via may be desired or required. A route of interest may also include one stemming from a bus-like circuit component and thus multiple connections may be desired or required.

A route of interest may further include one that carries certain electric current to an extent where strand routing including a bundle or multiple strands of routes may be desired or preferred. The electronic design identified at 302 may include any electronic designs that may be used as an input to a synthesis tool (e.g., behavior synthesis tool, logic synthesis tool, etc.), a floor planner, a placement tool, a router, an ECO (engineering change order) module or tool, a post-route optimization module or tool so that the method or system may generate new design components, modify existing design components, performing fixes or repairs, or even performing rip-up-and-reroute for the electronic designs.

The method or system may further identify one or more design rules at 304. The one or more design rules may include, for example, wire and/or via spacing rules, design rules governing track patterns, via cut-to-cut rules, via enclosure rules, via cut-size rules, etc. The method or system may identify one or more regions at 306 based at least on part upon the one or more design rules identified at 304 in identical or substantially similar manners as those described for reference numeral 202 of FIG. 2 and determine seeding segments along the route of interest based at least in part upon the one or more regions at 308 in identical or substantially similar manners as those described for reference numeral 204 of FIG. 2. For example, the method or system may use identify a via along the route of interest identified at 302 and determine one or more regions that need to be blocked or removed from the routing resource by using the via cut-to-cut rule(s) for the subsequent implementation of an addition route for the route of interest. In some embodiments where an additional route is to be generated for the route of interest, the method or system determine at least two seeding segments for the route of interest, where one seeding segment may accommodate the source additional node, and another seeding segment may accommodate the destination additional node for the additional route.

At 310, the method or system may identify a first additional node and a second additional node along or in the seeding segments determined at 306. In some of these embodiments illustrated in FIG. 3, the method or system may identify the first additional node in one seeding segment and the second additional node in another seeding segment. In these embodiments, neither the first additional node nor the second additional node includes or is associated with any connectivity information to guide a router to implement an additional route connecting both additional nodes. Rather, the router will be instructed to search for connectivity when encountering one of these two additional nodes.

At 312, the method or system may search for connectivity information for a viable routing solution from the first additional node by using an additional connectivity iterator based at least in part upon the one or more design rules identified at 304. An additional connectivity iterator iterates over all the objects or entities (e.g., two-dimensional shapes in a layout, a point such as the center of a global cell, etc.) that the route touches or may touch (e.g., the explicit additional route) to find one or more additional nodes incident to an object or entity.

In some embodiments, the method or system includes two types of iterators—normal connectivity iterators and additional connectivity iterators. A normal connectivity iterator iterates over all the objects or entities that a route touches or may touch to identify one or more Steiner points or design components (e.g., a pin, terminal, pad, etc.) incident to an object or entity by looking up the connectivity information in, for example, a connectivity list to complete a route in the normal connectivity. A normal connectivity iterator ignores or does not have access to additional nodes in the additional connectivity.

An additional connectivity iterator iterates over all the objects or entities that an additional route touches or may touch to find one or more additional nodes incident to an object or entity as well as other objects or entities to find a viable additional route to be included the additional connectivity. An additional connectivity iterator may also access the Steiner points and design components as a normal connectivity iterator in some embodiments, although a normal iterator ignores or cannot access information included in the additional connectivity. In some embodiments, the method or system may use only the additional iterators without the normal iterators although may be at a higher cost due to the nature of the additional connectivity iterators to search for information needed to complete a route.

In addition or in the alternative, an additional iterator may also serve to determine whether or not an additional node may be removed. For example, an additional connectivity iterator may determine whether the additional route for which some additional nodes are created has been removed. If so, the additional connectivity iterator may determine that these additional nodes may be removed. As another example, the additional connectivity iterator, due to its capability to access the normal connectivity, may determine whether a normal connectivity route from which the seeding segments are created has been removed or modified such that some additional nodes for an additional route can no longer be added at their original locations. If so, the additional connectivity iterator may determine that these additional nodes and even the additional route in some embodiments may be removed. Various redundancy or dangler removal processes associated with the normal connectivity may ignore or be prevented from accessing the additional connectivity and thus may not be able to determine whether or not an additional node or an additional route may be removed.

At 314, the method or system may determine the first final location for the first additional node based at least in part upon the search results of 312. As described above with reference to FIG. 2, an additional node may not necessarily have a fixed location when first added to a seeding segment and may have an approximate location in a seeding segment.

For example, a designer may simple click somewhere in a seeding segment to indicate the addition or creation of an additional node in the seeding segment. The method may use a router alone or in conjunction with an additional connectivity iterator to determine the final location of the additional route segment connected to the first additional node for the additional route and thus determines the first final location for the first additional node at 314. At 316, the method or system may connect the first additional node and the second additional node with an additional route based at least in part upon the continual or continuous search for connectivity from the first additional node to the second additional node. In some embodiments, the method or system identifies (if pre-existing) or creates (if non-existing) a new route type, which is different from the route type(s) of routes in the normal connectivity, for the additional route generated at 316.

Figure 4:
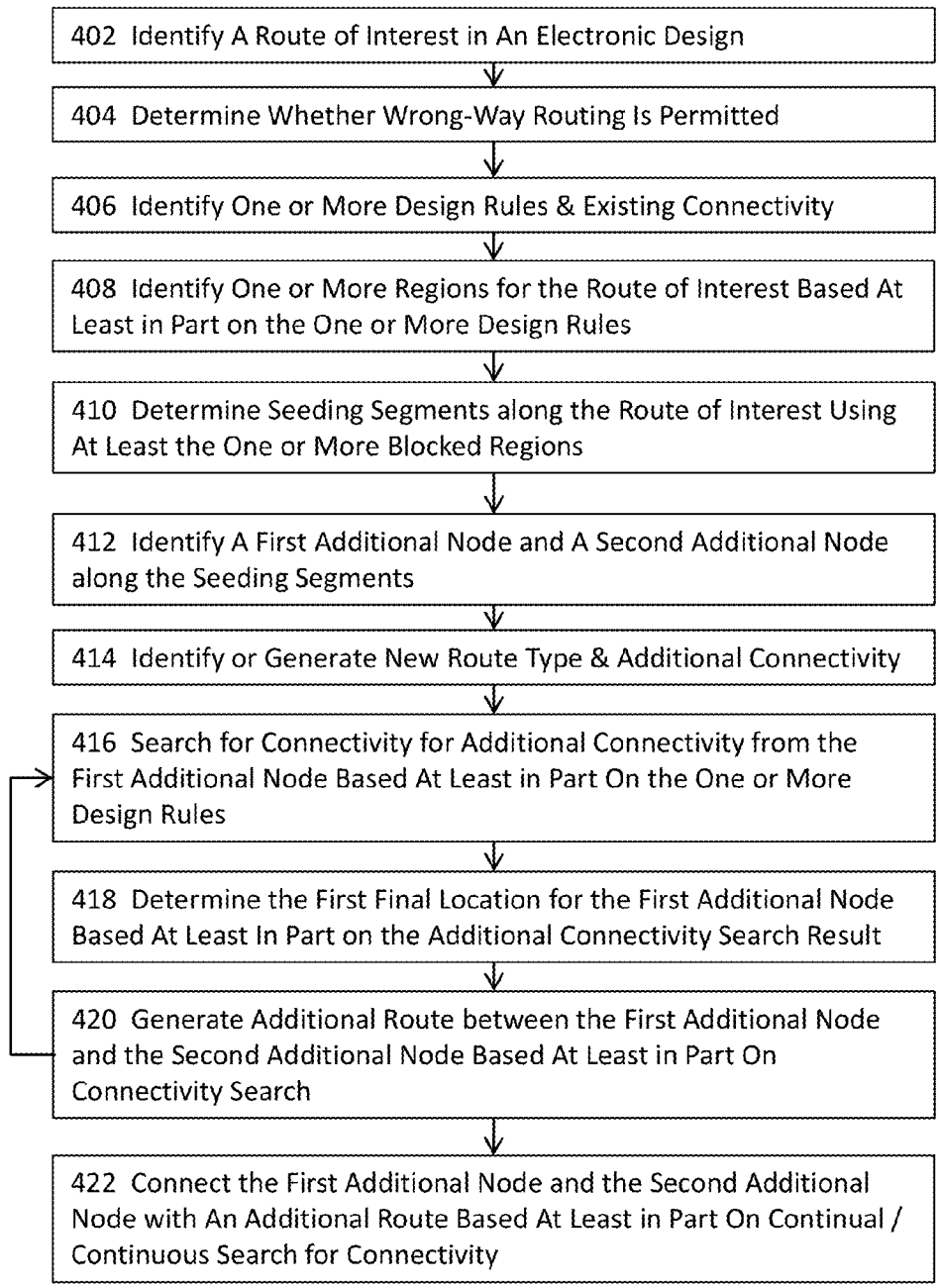
FIG. 4 illustrates a more detailed flow diagram for implementing additional connectivity for electronic designs in some embodiments.

FIG. 4 illustrates a more detailed flow diagram for implementing additional connectivity for electronic designs in some embodiments. In these embodiments illustrated in FIG. 4, the method or system may identify a route of interest in an electronic design at 402 in identical or substantially similar manners as those described above for reference numeral 302 with reference to FIGS. 2-3. The method or system may further determine whether wrong-way routing is permitted at least for a region enclosing the route of interest at 404. Wrong-way routing includes the implementation of routes in more than one routing direction in a layer or a region thereof.

For example, wrong-way routing indicates the implementation of routes in, for example, the vertical routing direction where the horizontal routing direction has been designated as the preferred routing direction. At 406, the method or system may identify one or more design rules in identical or substantially similar manners as those described for reference numeral 304 of FIG. 2 above. The method or system may then identify one or more regions for the route of interest based at least in part upon the one or more design rules at 408 and determine seeding segments along the route of interest using at least the seeding segments at 410 in identical or substantially similar manners as those described above for FIG. 2.

A first additional node and a second additional node may be identified at 412, and the method or system may identify (if pre-existing) or create (if non-existing) a new route type for additional routes that connect additional nodes at 414. The method or system may search for connectivity information for the additional connectivity from the first additional node based at least in part upon one or more design rules at 416. For example, the method or system may search for connectivity information for an additional route to be implemented by finding one or more additional nodes (e.g., the first additional node), objects, or entities based at least in part upon the pertinent design rules that govern the additions of route segments or other circuit components (e.g., vias).

The connectivity search results at 416 may be stored in the additional connectivity but not the normal connectivity in some embodiments. At 418, the method or system may determine the first final location for the first additional node based at least in part upon the additional search results from 416. The method or system may then generate an additional route to interconnect the first additional node and the second additional node based at least in part upon the connectivity search until the second additional node is reached at 420. The method or system may add necessary design components to the electronic design as the additional route is being implemented.

In some example where wrong way routing is not allowed in at least a region including the route of interest, the method or system may generate the additional routes with one or more additional vias as the method or system searches for a viable solution for the additional route because no bends are allowed in an interconnect. In some embodiments where wrong way routing is allowed, the method or system may implement the additional route with one or more bends. At 422, the method or system may connect the first additional node and the second additional node with an addition route based at least in part upon continual or continuous search for connectivity in identical or substantially similar manners as those described for reference numeral 316 of FIG. 3 above.

Figure 5:
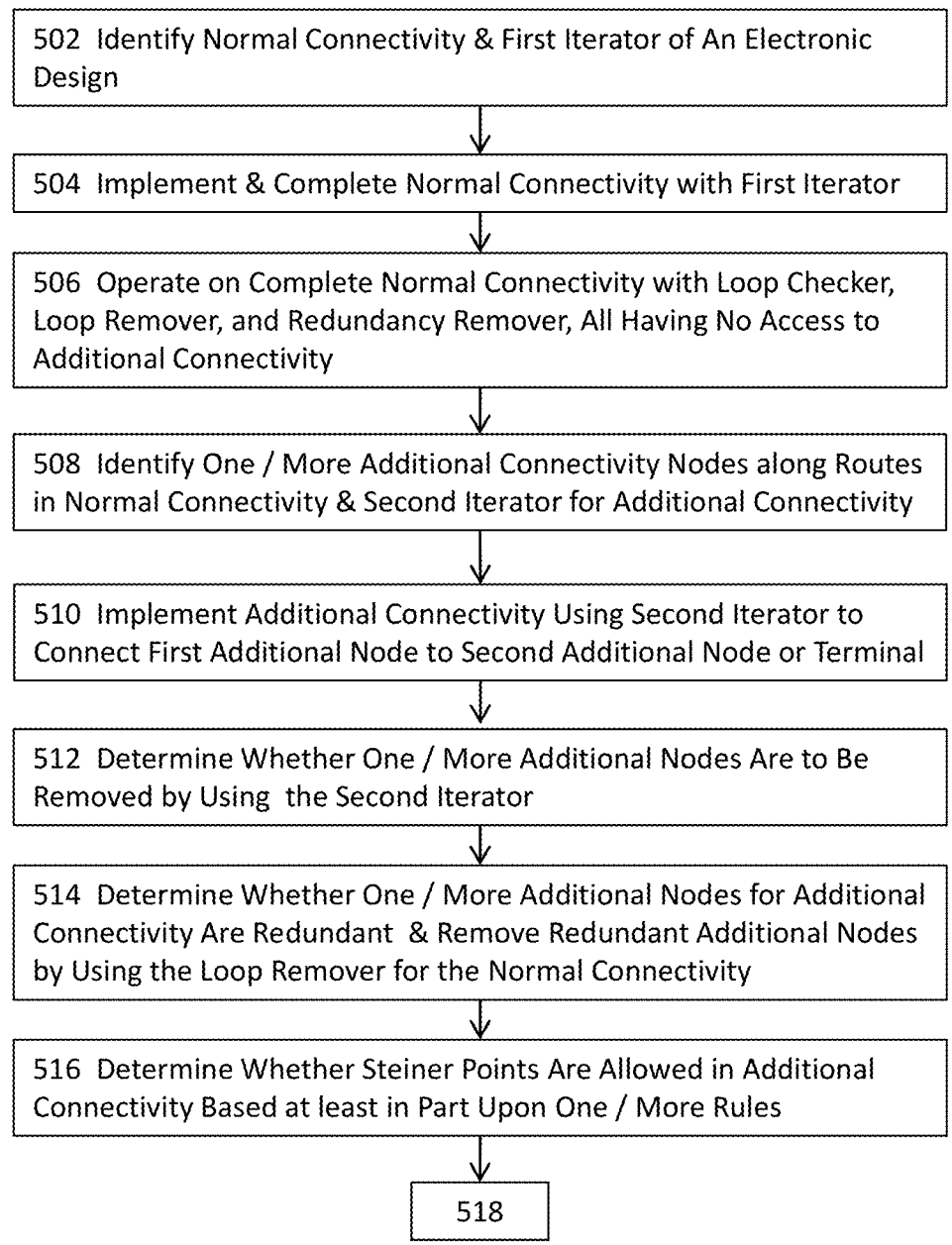
FIGS. 5-7 jointly illustrate a more detailed flow diagram for implementing additional connectivity for electronic designs in some embodiments.
Figure 6:
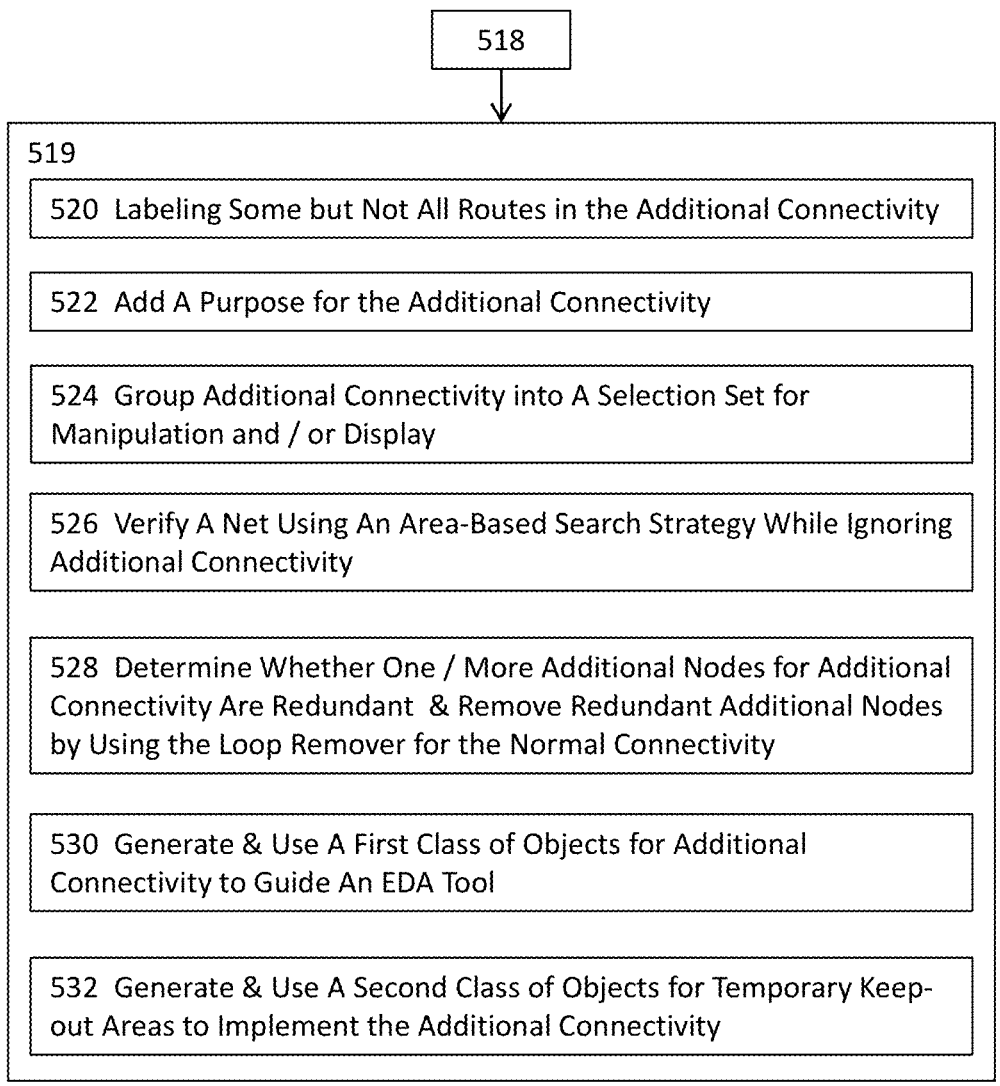
Figure 7:
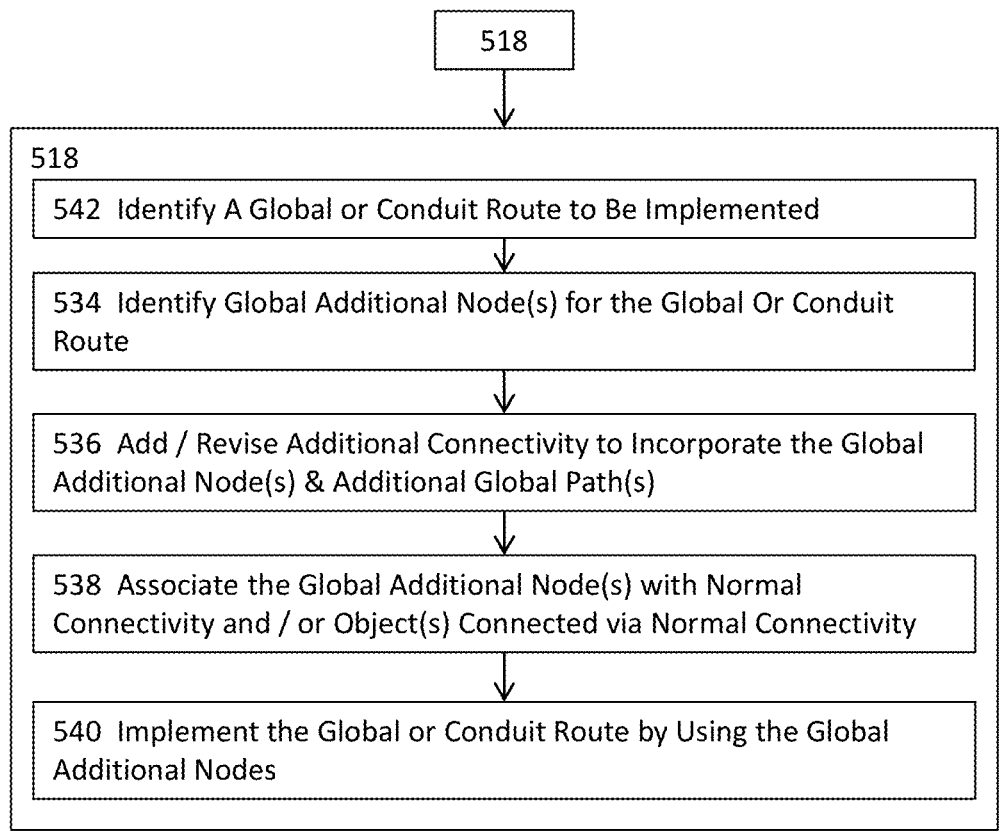

FIGS. 5-7 jointly illustrate a more detailed flow diagram for implementing additional connectivity for electronic designs in some embodiments. It shall be noted that although some of the acts in FIGS. 5-7 are connected by unidirectional arrowheads, some of these acts are not necessarily required to be performed in the sequence as illustrated by the arrowheads, and that some of these acts represent independent acts, which do not require or desire the results of one or more other acts, and thus are not connected to other acts by arrowheads. In these embodiments illustrated in FIGS. 5-7, the method or system may identify normal connectivity and at least one first iterator of an electronic design at 502.

In some of these embodiments, the at least one first iterator includes a normal connectivity iterator as that described above with reference to FIGS. 3-4. At 504, the method or system may implement and complete the normal connectivity with the first iterator where the normal connectivity explicitly specifies connectivity information in a data structure such as a list, a table, or a database. The method or system may perform one or more operations on the complete normal connectivity with a loop checker to identify loops in the routes, a loop remover to remove one or more loops, and/or a redundancy remover to remove redundant objects or entities in the electronic design at 506.

In some of these embodiments, none of the loop checker, the loop remover, and the redundancy remover operating on the normal connectivity are permitted to access the additional connectivity. Rather, the method or system may use specific processes or modules to perform the aforementioned functions. At 508, the method or system may identify one or more additional nodes along or near routes (e.g., depending upon whether the seeding segments include one- or two-dimensional entities) in the normal connectivity. The method or system may further identify a second iterator including an additional connectivity iterator at 508 as described above with reference to FIGS. 2-4.

At 510, the method or system may implement the additional connectivity using at least the second iterator to connect first additional node to the second additional node or an object or entity (e.g., a terminal, pin, or pad) in the electronic design. The method or system implements the additional connectivity by including the information or data about the first and second additional nodes, the additional routes or segments thereof, etc. At 512, the method or system may further determine whether one or more additional nodes for the additional connectivity are to be removed by using the second iterator.

As previously described, the removers or checkers for the normal connectivity either ignore or do not have access to the additional connectivity in some embodiments. Therefore, the method or system may identify (if pre-existing) or even generate (if non-existing) the second connectivity to manipulate the additional connectivity such as removing additional nodes or additional routes from the additional connectivity in these embodiments. At 514, the method or system may further optionally determine whether one or more additional nodes for the additional connectivity are redundant and remove the redundant additional nodes by using the loop remover for the normal connectivity.

As previously described, the removers or checkers for the normal connectivity either ignore or do not have access to the additional connectivity in some embodiments. Although the removers or checkers for the normal connectivity either ignore or do not have access to the additional connectivity in some embodiments, the method or system may nevertheless use the redundancy remover to remove a redundant additional node when it is determined that an additional node is only incident to a single object (e.g., the explicit route of the additional node) in some embodiments. In these embodiments, the redundancy remover for the normal connectivity may be used to remove such a redundant additional node. At 516, the method or system may optionally determine whether one or more Steiner points are allowed in the additional connectivity based at least in part upon one or more rules.

The one or more rules may include a first rule requiring a route stemming from or connecting to a Steiner point be incorporated in the additional connectivity if the Steiner point is allowed to be incorporated in the additional connectivity. Reference numeral 519 includes individual acts or groups of acts that may also be performed by the method or system utilizing various techniques described herein. At 520, the method or system may label or mark some but not necessarily all additional routes in the additional connectivity to indicate that these additional routes are in the additional connectivity but not the normal connectivity and thus need to be manipulated or managed accordingly.

At 522, the method or system may optionally add a purpose for the additional connectivity. A purpose includes a user-definable specification that provides a way to identify or distinguish the shape(s) by its use in the design. For example, a designer may wish to identify or distinguish fill, power, ground, clock, and signal lines from each other in the design, and to have these different components be drawn or displayed in a layout editor with different colors or other visibly distinguishable patterns. The designer in this example may define a purpose to specify his or her requirements. At 524, the method or system may optionally group the additional connectivity into a selection set for manipulation and/or display.

At 526, the method or system may verify a net using an area-based search strategy while ignoring the additional connectivity due to the possible appearances of, for example, loops in the additional connectivity in some embodiments. At 528, the method or system may optionally determine whether one or more additional nodes for the additional connectivity are redundant and remove these one or more additional nodes by using the loop remover for the normal connectivity.

As previously described, the removers or checkers for the normal connectivity either ignore or do not have access to the additional connectivity in some embodiments. Although the removers or checkers for the normal connectivity either ignore or do not have access to the additional connectivity in some embodiments, the method or system may nevertheless use the redundancy remover to remove a redundant additional node when it is determined that an additional node is only incident to a single object (e.g., the explicit route of the additional node) in some embodiments. In these embodiments, the redundancy remover for the normal connectivity may be used to remove such a redundant additional node. At 530, the method or system may optionally identify (if pre-existing) or generate (if non-existing) and use a first class of objects within the realm of object-oriented programming for the additional connectivity to guide an EDA (electronic design automation) tool to implement electronic designs in some embodiments.

The first class of objects is to distinguish the additional connectivity and any information or data associated therewith from the normal connectivity which can be manipulated and managed by conventional EDA tools. At 532, the method or system may optionally identify or generate a second class of objects for temporary or permanent keep-out areas to implement the additional connectivity. For example, the method or system may use a second class of objects for the one or more regions identified or determined at 202, 306, or 408. The method or system may identify a global or conduit route to be implemented at 542 and identify one or more global additional nodes for the global or conduit route at 534.

As described above, these one or more global additional nodes may not have fixed locations in the design space at least at the time these one or more additional nodes are identified not only because of the nature of additional nodes (to indicate that connectivity is to be searched but not looked up as in Steiner points) but also because of the nature of the global routes and conduit routes, which provide general guidance for the detail router to implement detail routes but do not follow fixed paths or have fixed locations.

At 536, the method or system may add or revise the additional connectivity to incorporate the global additional nodes and one or more additional routes connecting the global additional nodes. At 538, the method or system may further associate global additional nodes with the normal connectivity and/or objects or entities connected to the global or conduit route via normal connectivity. At 540, the method or system may implement the global or conduit route by using at least the global additional nodes. The global additional nodes may share all the attributes of additional nodes described in the aforementioned paragraphs.

FIGS. 8-12 illustrate a working example of the application of certain techniques described here for implementing additional connectivity for a portion of a simplified electronic design in some embodiments. The portion of a simplified electronic design illustrated in FIG. 8 includes interconnect segments in different layers. For example, the illustrated layout includes interconnect segments connected to their respective pins 810 in the metal layer M2 802, interconnect segments in metal layer M3 804, and an interconnect segment in metal layer M4 806.

The method or system may identify, for example, the route including the via 808 as the route of interest for which an additional route is to be created by using some of the techniques described herein. It shall be noted that although the electronic design illustrated in FIGS. 8-12 is a portion of a layout, various techniques described herein may also apply electronic designs at other abstraction levels not limited to a layout. In addition, the routes illustrated in FIGS. 8-12 indicate that wrong way routing is not allowed in at least the illustrated portion and layers of the electronic design. Nonetheless, various techniques described herein apply with full and equal effects to electronic designs where wrong way routing is allowed.

Figure 9:
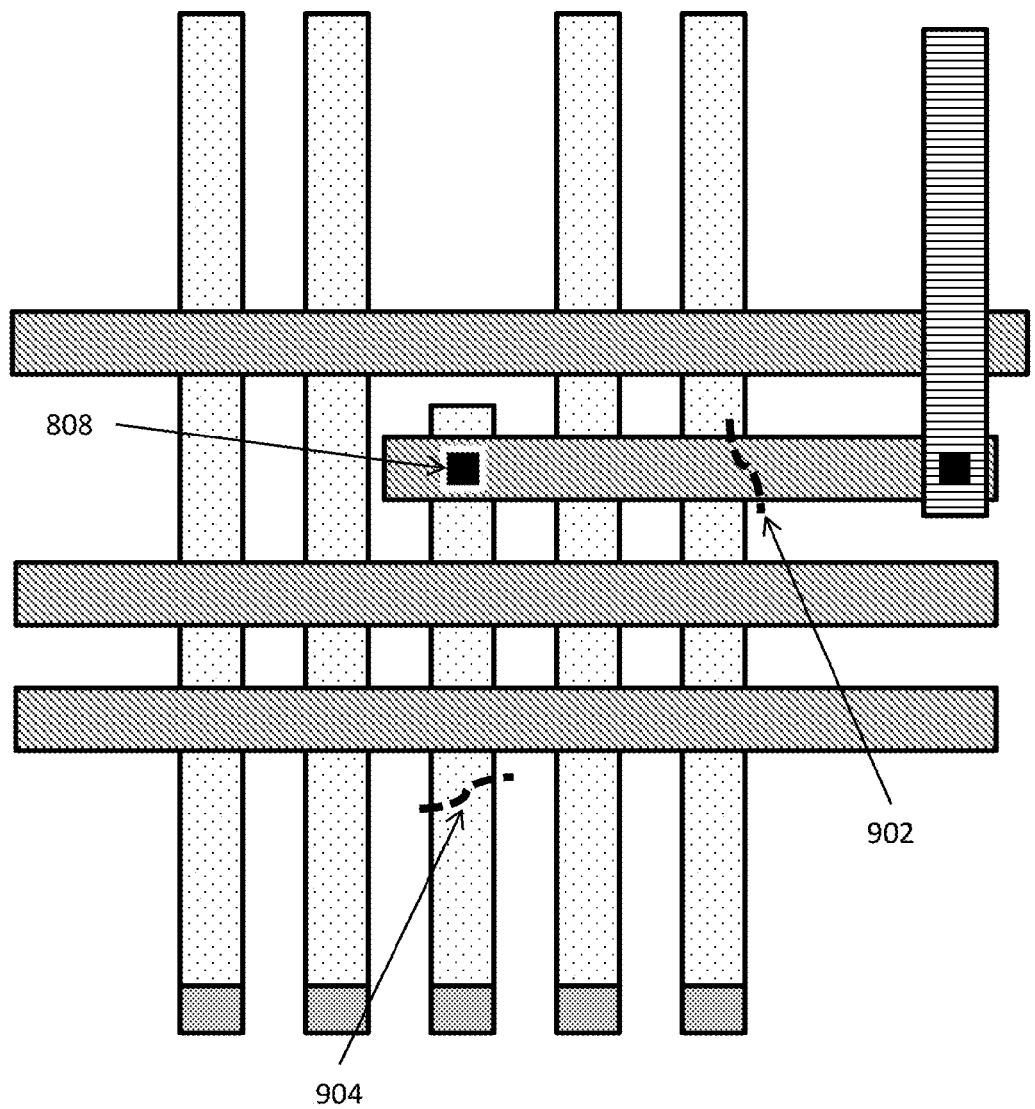
Figure 10:
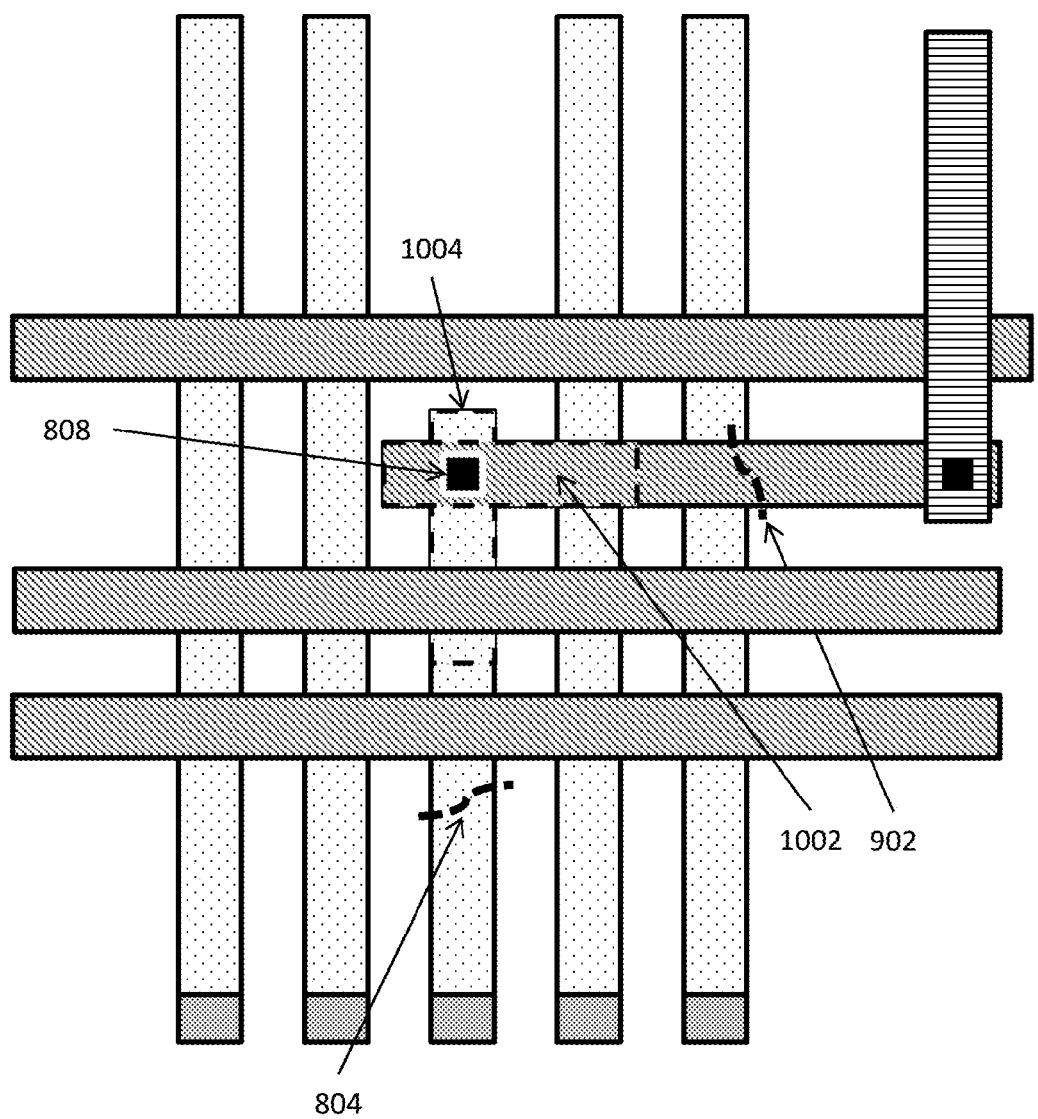

FIG. 9 illustrates that the method and system identifies two approximate locations 902 and 904 as the potential locations of additional nodes along the route including via 808. FIG. 10 illustrates the identification or determination of regions for additional connectivity in some embodiments. The method or system may then identify one or more design rules and determine two regions based at least in part upon the one or more design rules as illustrated in FIG. 10. For example, the method or system may identify a via cut-to-cut rule that specifies the minimum spacing between two immediately neighboring vias or a same-mask or different-mask minimum spacing rule that specifies the minimal spacing between two immediately neighboring wires.

Based at least in part upon the identified design rules, the method or system may identify the first region 1002 and the second region 1004 that do not allow any insertion of vias. In the above example, the first region may be identified as a first keep-out region where no vias or interconnects may be inserted by considering the minimal spacing rule to clear the interconnect segments in metal layer M2 802 or M3 804 as well as to clear the via cut-to-cut rule due to the presence of via 808 along the route of interest. It shall be noted that the regions (e.g., the first region 1002 and the second region 1004) illustrated in FIG. 10 may be defined in many different ways not limited to two regions as illustrated in FIG. 10.

Figure 11:
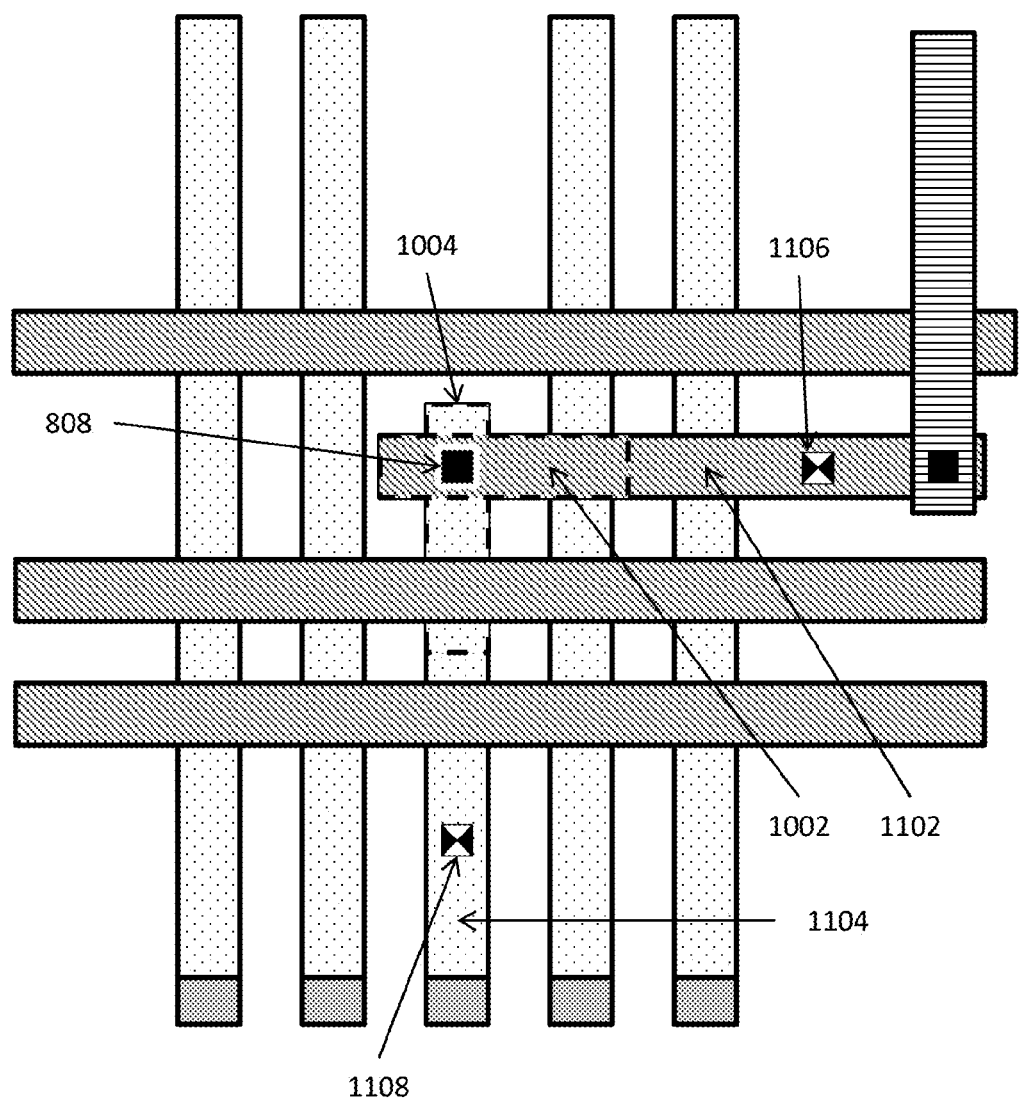

The method or system may identify both the first region 1002 and the second region 1004 as keep-out regions. That is, the method or system may remove both regions from the available routing resource such that the router does not trespass upon these two regions so as to violate one or more design rules. FIG. 11 illustrates the identification of two additional nodes in some embodiments. After the identification or determination of the first region 1002 and the second region 1004 as illustrated in FIG. 10, the method or system may then determine the first seeding segment 1102 for the horizontal route segment and the second seeding segment 1104 for the vertical route segment of the route of interest including via 808.

In this example including two dimensional shapes of the route segments, the first seeding segment 1102 may be determined by subtracting the first region 1002 from the horizontal route segment, and the second seeding segment 1104 may be determined by subtracting the second region 1004 from the vertical route segment although a seeding segment may be defined in many different manners as described above. The method or system may then add the first additional node 1106 at a first fixed location or a first approximate location in the first seeding segment 1102 and the second additional node 1108 at a second fixed location or a second approximate location in the second seeding segment 1104.

It shall be noted that the method or system may determine fixed locations or approximate locations for the first additional node and the second additional node. For example, the method or system may reference various pertinent design rules to search for and determine a fixed location to which an additional route may be connected. As another example, the method or system may identify an approximate location for the first additional node. As described previously, an additional node is not associated with explicitly specified connectivity, and a router encountering an additional node is to search for the requisite connectivity information (e.g., shapes) in order to implement an additional route.

Figure 12:
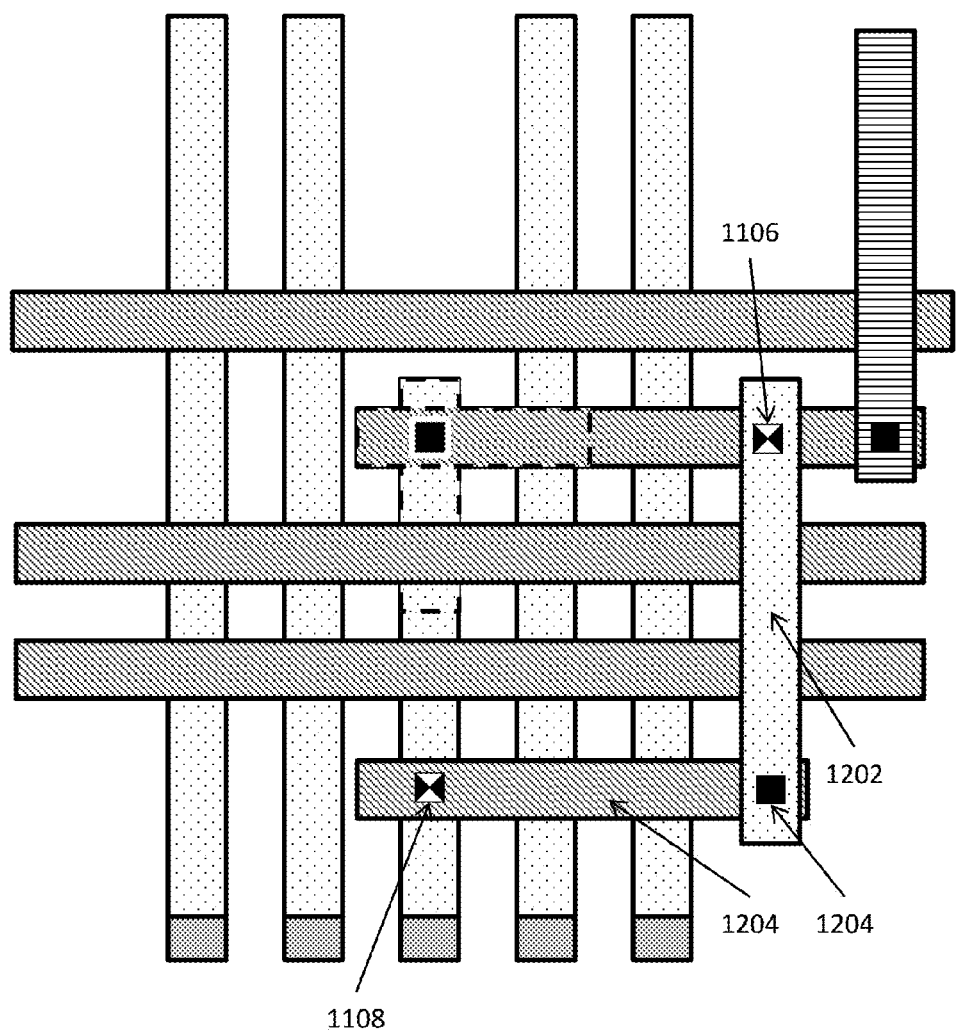

FIG. 12 illustrates the implementation of an additional route with two additional nodes for the route of interest in some embodiments. More specifically, the method or system may invoke a router to find viable routing solution for the additional route. The router (e.g., a point-to-point router) may start form the first additional node which indicates to the router not to look up connectivity information due to its unavailability at the first additional node 1106 but to utilize a search probe or an area based search strategy to search for connectivity information. For example, the method or system may provide the vertical track passing through the first additional node and the horizontal track passing through the second additional node to a spacetile punch engine to create the spacetiles by punching the horizontal and vertical tracks and use the spacetiles thus obtained as a search probe to search for viable routing solution for the additional route connecting the first additional node 1106 and the second additional node 1108.

The method or system may then encounter the first additional node 1106 which flags the router to utilize a search probe or an area based search strategy to search for connectivity information, rather than looking up connectivity information from a Steiner point. The method or system may then create the first additional route segment 1202 as the search probe proceeds along the spacetile to search for viable routing solutions. The method or system may, based on the fixed or approximate location of the second additional node 1108, further proceed with the search along the horizontal spacetile and create the second additional route segment 1204 until the second additional route segment 1204 reaches the second additional node 1108 or the vicinity thereof if the second additional node 1108 has an approximate location.

Figure 8:
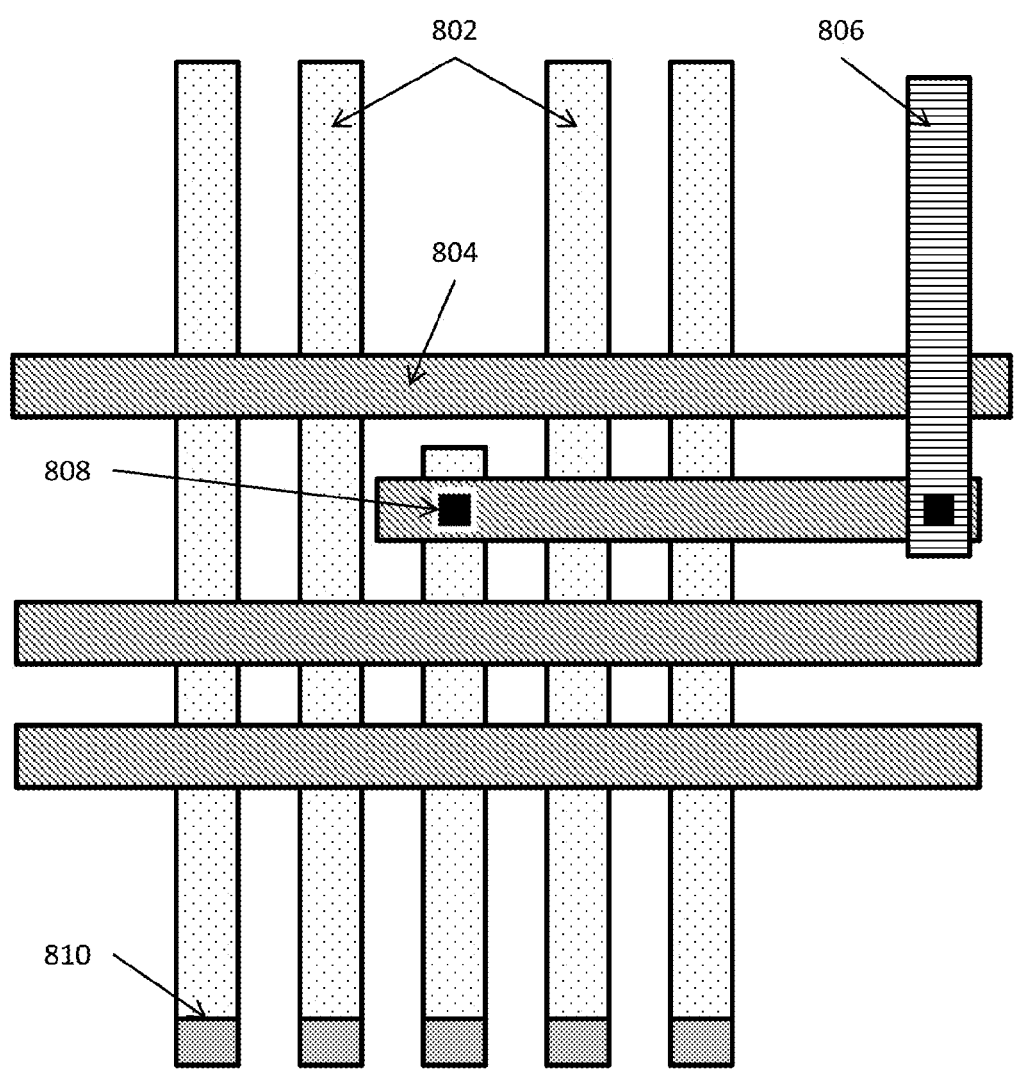
FIGS. 8-12 illustrate a working example of the application of certain techniques described here for implementing additional connectivity for a portion of a simplified electronic design in some embodiments.
Figure 12A:
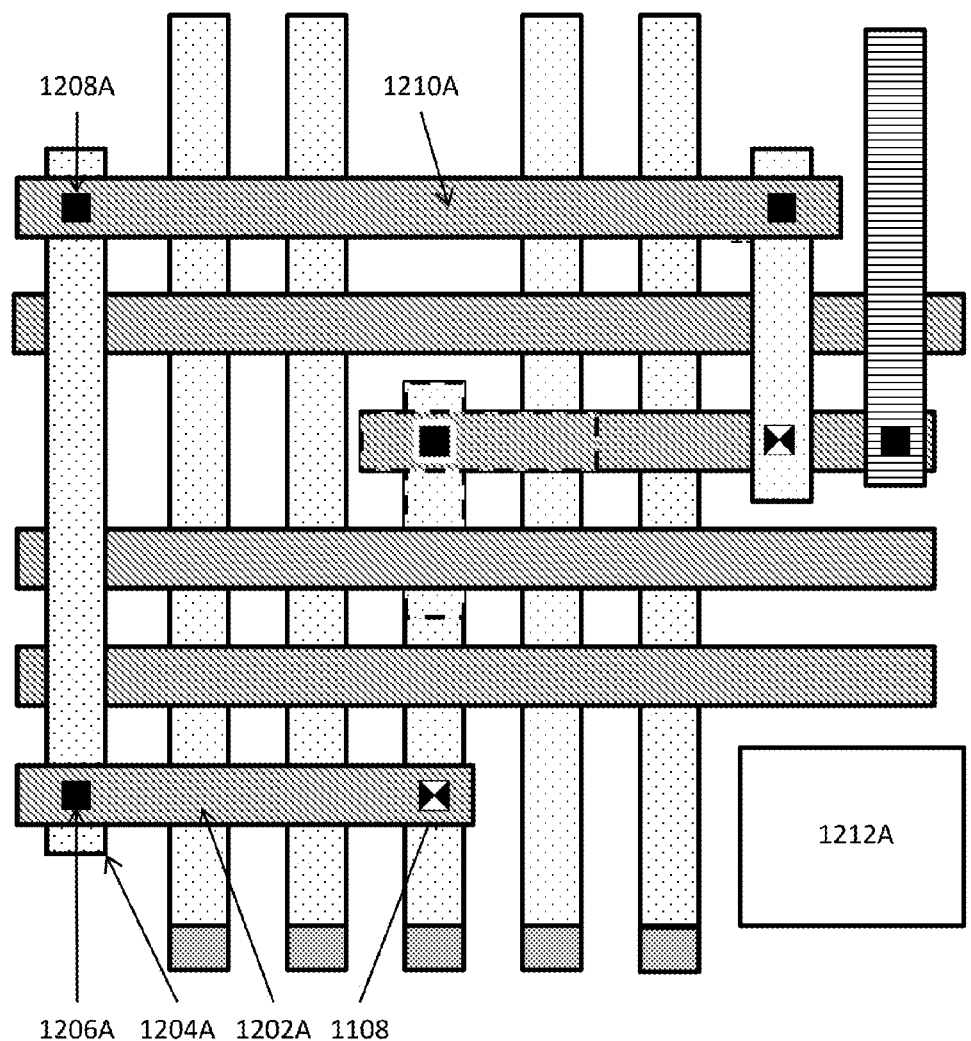
FIG. 12A illustrates the results of another working example of the application of certain techniques described here for implementing additional connectivity for the portion of the simplified electronic design illustrated in FIG. 8 in some embodiments.

FIG. 12A illustrates the results of another working example of the application of certain techniques described here for implementing additional connectivity for the portion of the simplified electronic design illustrated in FIG. 8 in some embodiments. In these embodiments, the electronic design includes an additional blockage 1212A, which prevents the creation of the additional route as illustrated in FIG. 12, and the method or system may generate another additional route including the horizontal additional route segment 1202A in metal layer M3, the first additional via 1206A, the vertical additional route segment 1204A in metal layer M2, the second additional via 1208A, and the horizontal route segment 1210A in metal layer M3 by using similar techniques described herein.

Figure 12B:
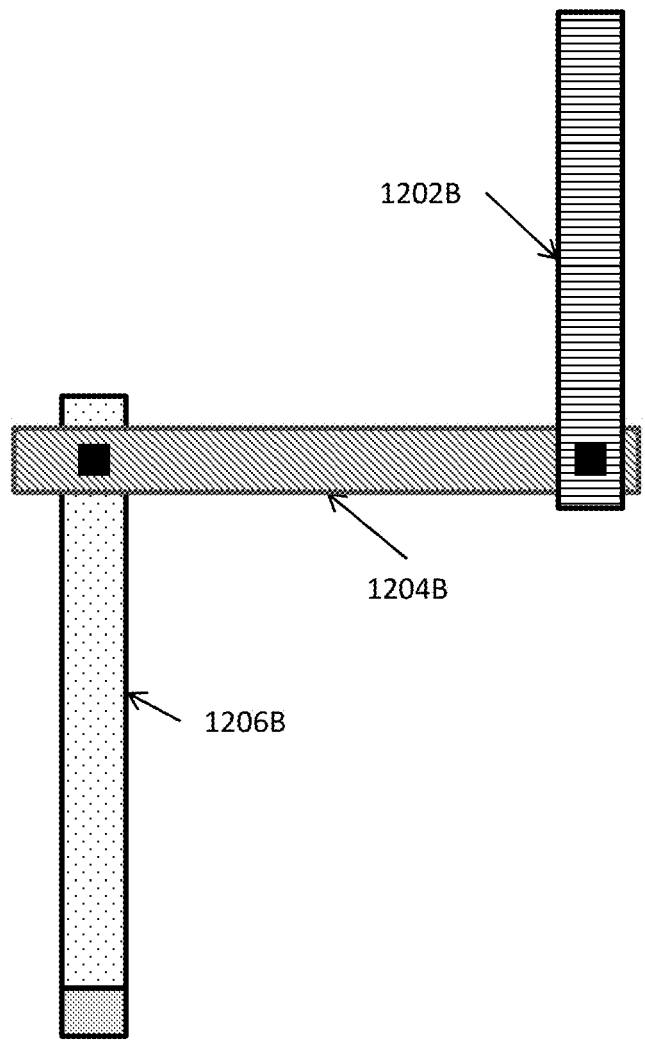
FIG. 12B illustrates some route segments of an electronic design in some embodiments.
Figure 12C:
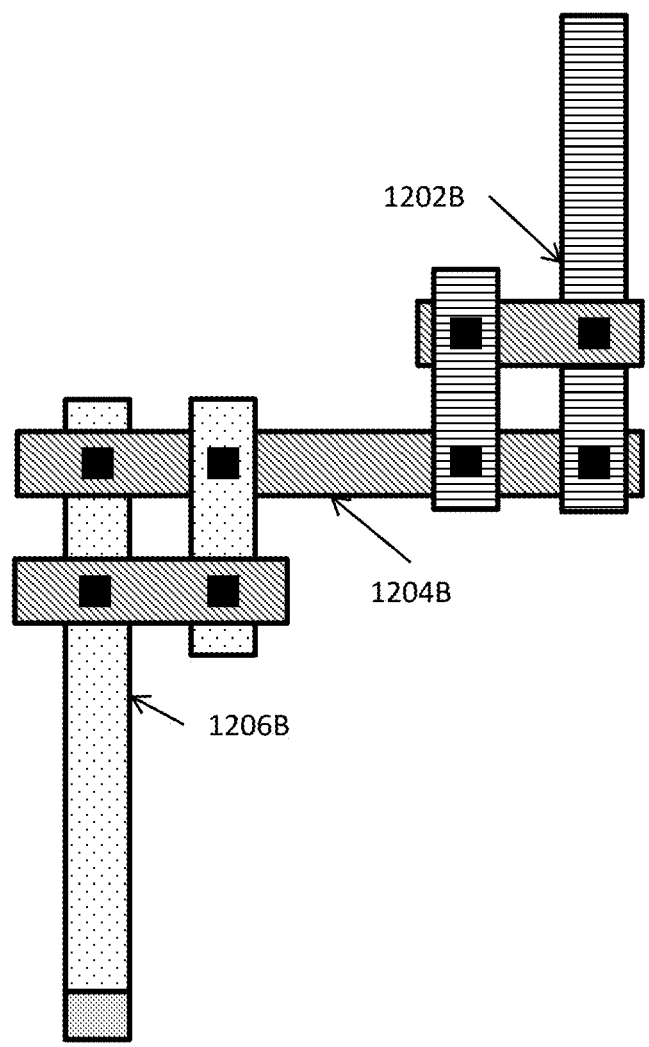
FIGS. 12C-G illustrate some results of implementing additional connectivity using some of the techniques described herein for the rote segments illustrated in FIG. 12B in some embodiments.
Figure 12D:
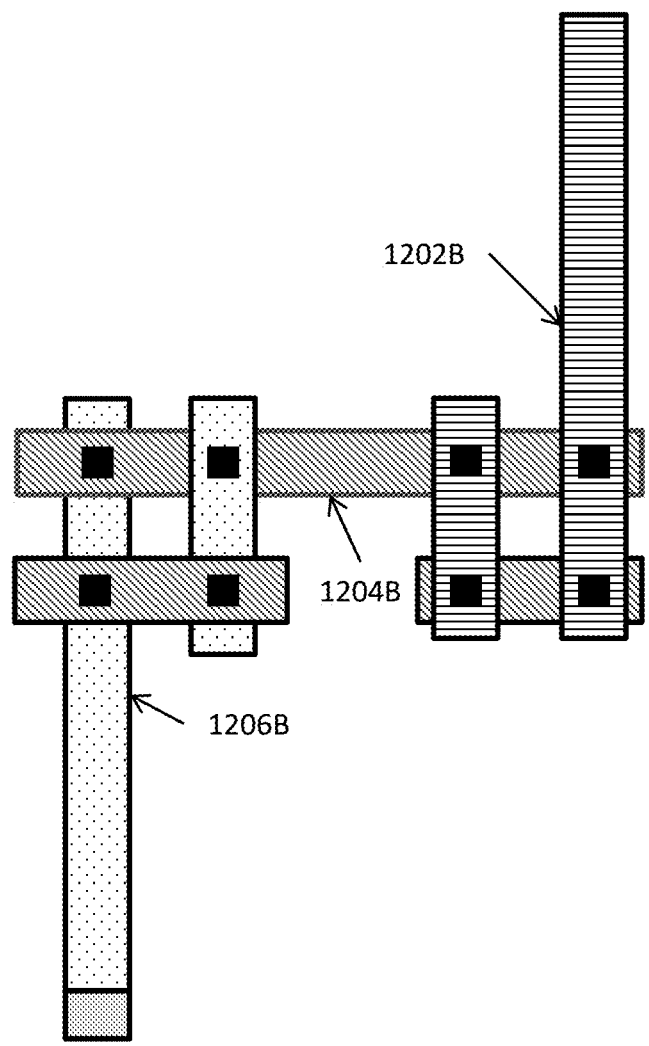
Figure 12E:
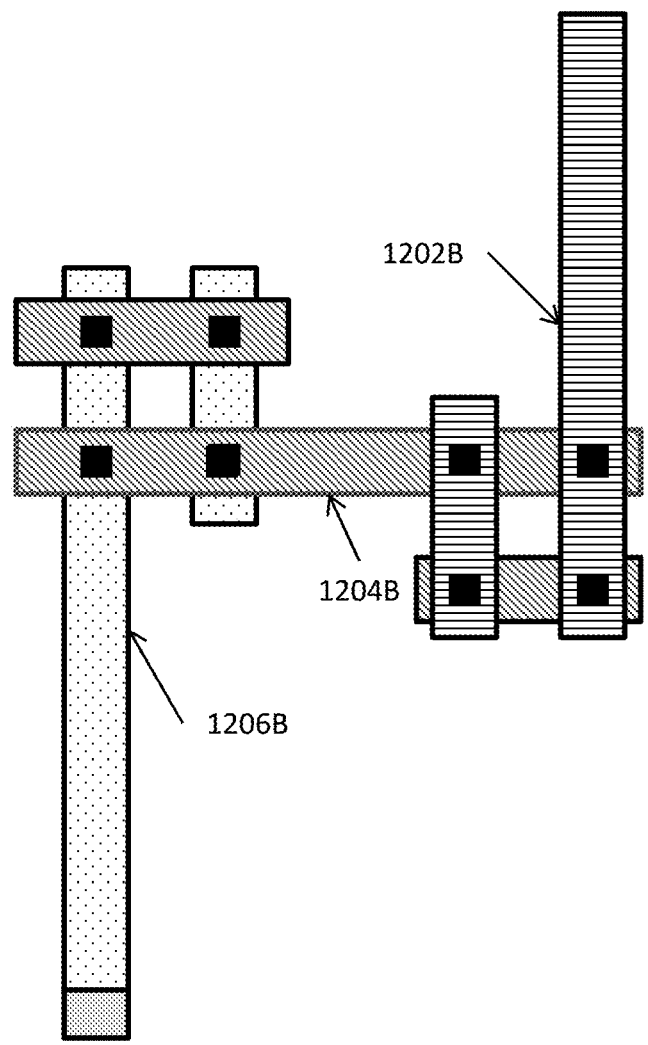
Figure 12F:
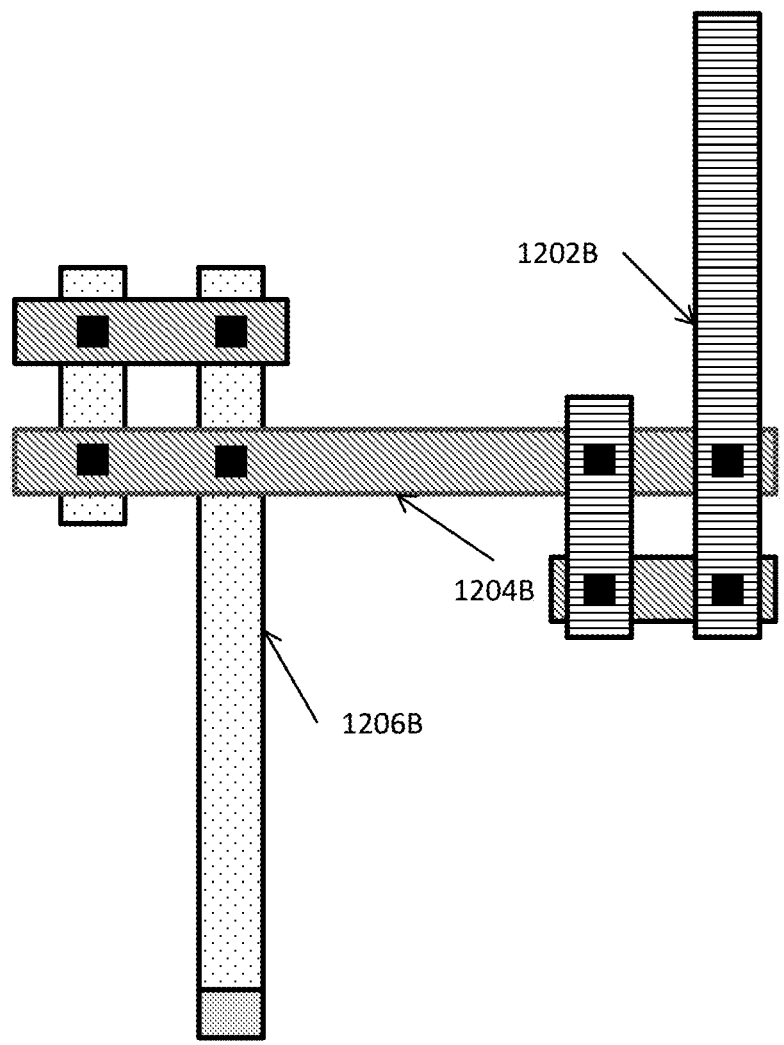
Figure 12G:
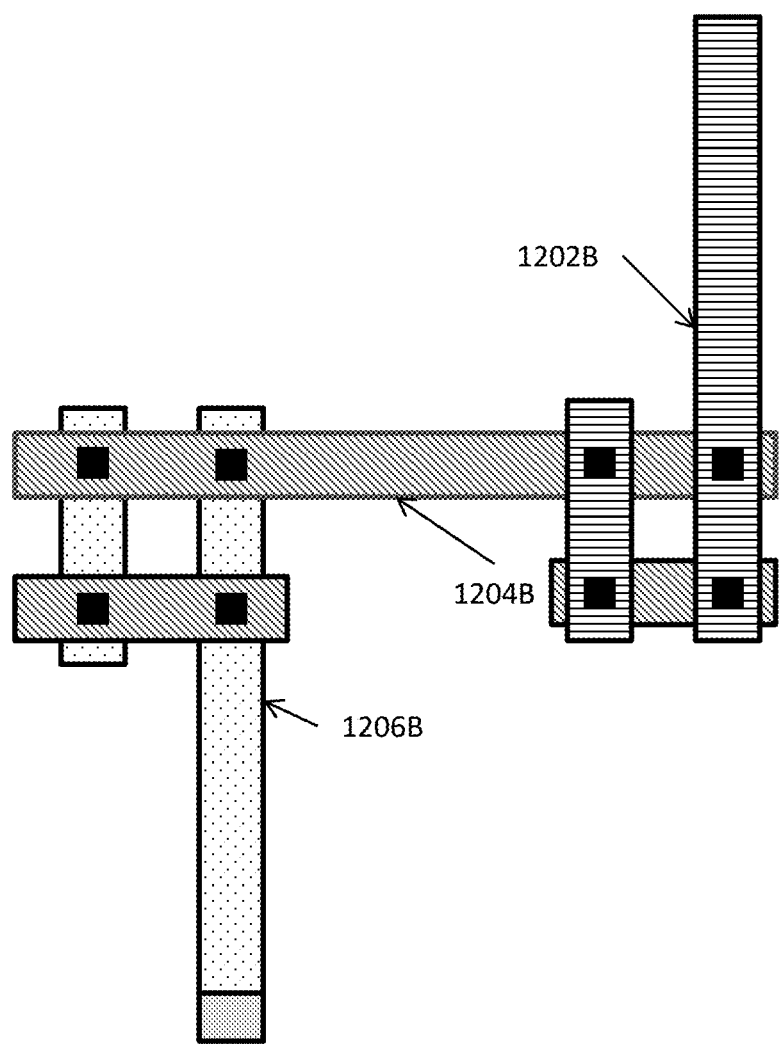

FIG. 12B illustrates a route having some route segments of an electronic design in some embodiments. The route illustrated in FIG. 12B includes the route segments 1202B in metal layer M4, 1204B in metal layer M3, and 1206B in metal layer M2. FIGS. 12C-G illustrate some different results of implementing additional connectivity using some of the techniques described herein for the rote segments illustrated in FIG. 12B in some embodiments.

System Architecture Overview

Figure 13:
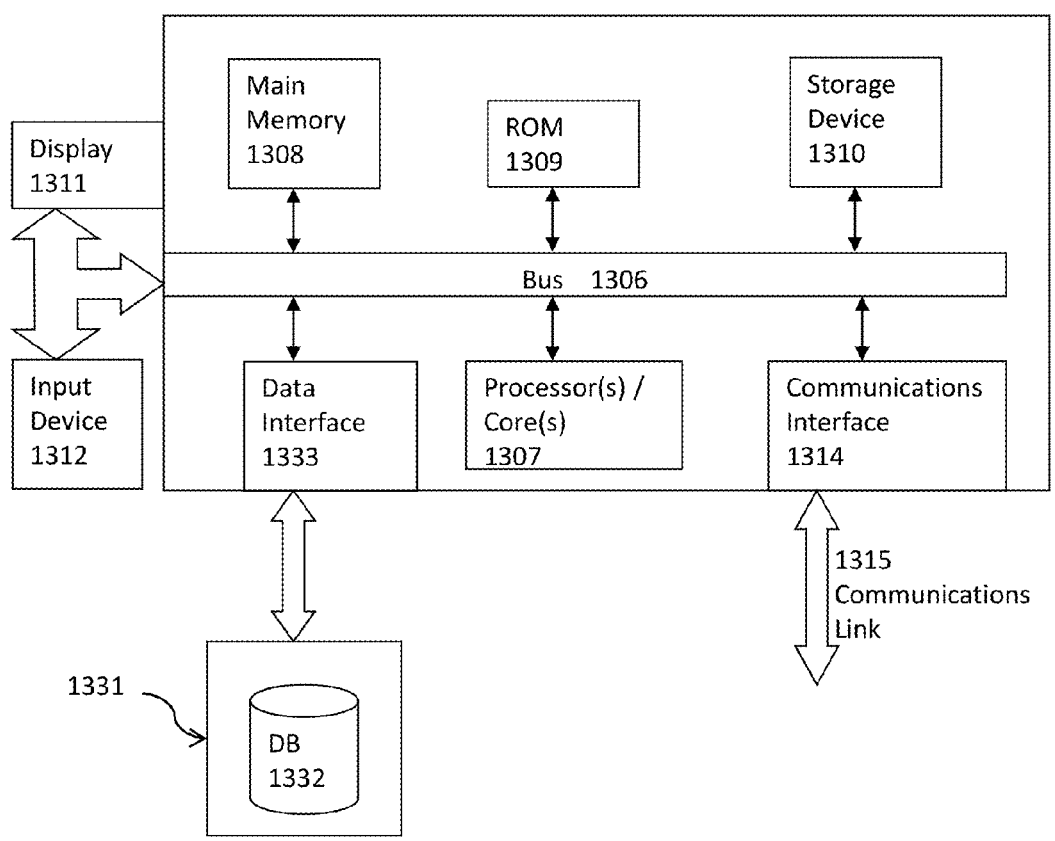
FIG. 13 illustrates a computerized system on which a method for implementing additional connectivity for electronic designs may be implemented.

FIG. 13 illustrates a block diagram of an illustrative computing system 1300 suitable for implementing additional connectivity for electronic designs techniques as described in the preceding paragraphs with reference to various figures. Computer system 1300 includes a bus 1306 or other communication mechanism for communicating information, which interconnects subsystems and devices, such as processor 1307, system memory 1308 (e.g., RAM), static storage device 1309 (e.g., ROM), disk drive 1310 (e.g., magnetic or optical), communication interface 1314 (e.g., modem or Ethernet card), display 1311 (e.g., CRT or LCD), input device 1312 (e.g., keyboard), and cursor control (not shown).

According to one embodiment, computer system 1300 performs specific operations by one or more processor or processor cores 1307 executing one or more sequences of one or more instructions contained in system memory 1308.

Such instructions may be read into system memory 1308 from another computer readable/usable storage medium, such as static storage device 1309 or disk drive 1310. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

Various actions or processes as described in the preceding paragraphs may be performed by using one or more processors, one or more processor cores, or combination thereof 1307, where the one or more processors, one or more processor cores, or combination thereof executes one or more threads. For example, the act of specifying various net or terminal sets or the act or module of performing verification or simulation, etc. may be performed by one or more processors, one or more processor cores, or combination thereof. In one embodiment, the parasitic extraction, current solving, current density computation and current or current density verification is done in memory as layout objects or nets are created or modified.

The term "computer readable storage medium" or "computer usable storage medium" as used herein refers to any medium that participates in providing instructions to processor 1307 for execution. Such a medium may take many forms, including but not limited to, non-volatile media and volatile media. Non-volatile media includes, for example, optical or magnetic disks, such as disk drive 1310. Volatile media includes dynamic memory, such as system memory 1308.

Common forms of computer readable storage media includes, for example, electromechanical disk drives (such as a floppy disk, a flexible disk, or a hard disk), a flash-based, RAM-based (such as SRAM, DRAM, SDRAM, DDR, MRAM, etc.), or any other solid-state drives (SSD), magnetic tape, any other magnetic or magneto-optical medium, CD-ROM, any other optical medium, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 1300. According to other embodiments of the invention, two or more computer systems 1300 coupled by communication link 1315 (e.g., LAN, PTSN, or wireless network) may perform the sequence of instructions required to practice the invention in coordination with one another.

Computer system 1300 may transmit and receive messages, data, and instructions, including program, i.e., application code, through communication link 1315 and communication interface 1314. Received program code may be executed by processor 1307 as it is received, and/or stored in disk drive 1310, or other non-volatile storage for later execution. In an embodiment, the computer system 1300 operates in conjunction with a data storage system 1331, e.g., a data storage system 1331 that contains a database 1332 that is readily accessible by the computer system 1300. The computer system 1300 communicates with the data storage system 1331 through a data interface 1333. A data interface 1333, which is coupled to the bus 1306, transmits and receives electrical, electromagnetic or optical signals that include data streams representing various types of signal information, e.g., instructions, messages and data. In embodiments of the invention, the functions of the data interface 1333 may be performed by the communication interface 1314.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

We claim:

1. A computer implemented method for implementing additional connectivity for an electronic design, comprising:
    using at least one processor or at least one processor core to perform a process the process comprising:
    identifying one or more regions for a route in normal connectivity that is accessible by a connectivity iterator module that iterates over a first plurality of geometric entities for an electronic design;
    identifying a plurality of seeding segments from the route based at least in part upon the one or more regions;
    generating, at a different connectivity iterator module, one or more additional routes in different connectivity that is different from the normal connectivity and is accessible by the different connectivity iterator module for the electronic design; and
    implementing a physical design of the electronic design at least by removing one or more redundancies or one or more loops with the different connectivity iterator module from the physical design based at least in part upon the plurality of additional nodes.

2. The computer implemented method of claim 1, further comprising:
    identifying the plurality of additional nodes in the plurality of seeding segments; and
    incorporating the plurality of additional nodes and the one or more additional routes into additional connectivity that is different from the normal connectivity.

3. The computer implemented method of claim 1, wherein the act of generating the one or more additional routes is performed without disturbing the normal connectivity that includes a plurality of Steiner points and the route.

4. The computer implemented method of claim 1, the process further comprising:
    identifying one or more design rules, wherein
        the act of identifying the one or more regions is performed based at least in part upon the one or more design rules, and
        the one or more seeding segments are determined by subtracting the one or more regions from a first geometric entity including the route.

5. The computer implemented method of claim 1, the process further comprising:
    searching for connectivity for a viable routing solution using a search probe or a search strategy when the search probe or the search strategy encounters a first additional node of the plurality of additional nodes instead of looking up the connectivity in a data structure, wherein
        the connectivity for the viable routing solution does not alter the normal connectivity including the route.

6. The computer implemented method of claim 5, further comprising:

determining a final location of a first additional node of the plurality of additional nodes based at least in part upon results of searching for the connectivity.

7. The computer implemented method of claim 5, further comprising:
identifying a normal connectivity iterator for manipulating the normal connectivity; and
identifying an additional connectivity iterator for manipulating the additional connectivity, wherein
the normal connectivity iterator maintains the normal connectivity and ignores or does not have access to the additional connectivity,
the additional connectivity iterator maintains the additional connectivity and is allowed to access both the normal connectivity and the additional connectivity, and
the act of searching for the connectivity is performed by using at least the additional connectivity iterator.

8. The computer implemented method of claim 1, the process further comprising:
designating the one or more regions as keep-out area to remove the one or more regions from routing resource that is used to implement the one or more additional routes.

9. The computer implemented method of claim 1, the process further comprising:
determining whether or not wrong-way routing is permitted in at least a portion of the electronic design including the plurality of additional routes;
determining whether or not spacetiles are used to implement at least one of the plurality of additional routes; and
determining a route type for the plurality of additional routes, wherein the route is not of the new route type.

10. The computer implemented method of claim 1, the process further comprising:
determining whether at least one additional node of the plurality of the one or more additional nodes is to be removed based at least in part upon one or more rules, wherein
the at least one additional node is to be removed by an additional connectivity iterator associated with the additional connectivity but not by a normal connectivity iterator associated with the normal connectivity, and
determining whether an additional node of the plurality of the one or more additional nodes is redundant by using the additional connectivity iterator and not by using the normal connectivity iterator.

11. The computer implemented method of claim 1, the processing further comprising:
determining whether a Steiner point is allowed in the additional connectivity; and
adding a first route connecting to the Steiner point to the additional connectivity when the Steiner point is determined to be allowed in the additional connectivity.

12. The computer implemented method of claim 1, the process further comprising at least one of:
labeling some but not all of additional routes in the additional connectivity;
adding a purpose for the additional connectivity;
grouping the additional connectivity into a selection set for one or more additional operations; and
verifying a net in the electronic design by using a search strategy while ignoring the additional connectivity.

13. The computer implemented method of claim 1, the process further comprising at least one of:
determining whether one or more additional nodes of the plurality of additional nodes for the additional connectivity are redundant in the electronic design based at least in part upon the route;
generating and using a first class of objects for the additional connectivity to guide one or more electronic design automation tools; and
generating and using a second class of objects for temporarily blocking the one or more regions to implement the additional connectivity.

14. The computer implemented method of claim 1, the process further comprising:
identifying a global or conduit route in the electronic design;
identifying one or more global additional nodes for the global or conduit route; and
updating the additional connectivity to incorporate the one or more global additional nodes.

15. The computer implemented method of claim 14, the process further comprising:
associating the one or more global additional nodes with the normal connectivity and / or one or more circuit components connected via the normal connectivity; and
implementing the global or conduit route by using the one or more global additional nodes.

16. A system for implementing additional connectivity for an electronic design, comprising:
at least one processor or at least one processor core that is at least to:
identify one or more regions for a route in normal connectivity that is accessible by a connectivity iterator that iterates over a first plurality of geometric entities for an electronic design;
identify a plurality of seeding segments from the route based at least in part upon the one or more regions;
generate, at a different connectivity iterator, one or more additional routes in different connectivity that is different from the normal connectivity and is accessible by the different connectivity iterator module for the electronic design; and
implement a physical design of the electronic design at least by removing one or more redundancies or one or more loops with the different connectivity iterator from the physical design based at least in part upon the plurality of additional nodes.

17. The system of claim 16, wherein the at least one processor or at least one processor core is further to:
search for connectivity for a viable routing solution using a search probe or a search strategy when the search probe or the search strategy encounters a first additional node of the plurality of additional nodes instead of looking up the connectivity in a data structure, wherein the connectivity for the viable routing solution does not alter the normal connectivity including the route, and
the at least one processor or at least one processor core generates the one or more additional routes without disturbing the normal connectivity that includes a plurality of Steiner points and the route.

18. The system of claim 17, wherein the at least one processor or at least one processor core is further to:
determine a final location of a first additional node of the plurality of additional nodes based at least in part upon results of searching for the connectivity; and
identify a normal connectivity iterator for manipulating the normal connectivity;

identify an additional connectivity iterator for manipulating the additional connectivity, wherein
the normal connectivity iterator maintains the normal connectivity and ignores or does not have access to the additional connectivity.

19. An article of manufacture comprising a non-transitory computer accessible storage medium having stored thereupon a sequence of instructions which, when executed by at least one processor or at least one processor core executing one or more threads, causes the at least one processor or the at least one processor core to perform a process for implementing additional connectivity for an electronic design, the process comprising:

identifying one or more regions for a route in normal connectivity that is accessible by a connectivity iterator module that iterates over a first plurality of geometric entities for an electronic design;

identifying a plurality of seeding segments from the route based at least in part upon the one or more regions;

generating, at a different connectivity iterator module, one or more additional routes in different connectivity that is different from the normal connectivity and is accessible by the different connectivity iterator module for the electronic design; and implementing a physical design of the electronic design at least by removing one or more redundancies or one or more loops with the different connectivity iterator module from the physical design based at least in part upon the plurality of additional nodes.

20. The article of manufacture of claim 19, the process further comprising:

searching for connectivity for a viable routing solution using a search probe or a search strategy when the search probe or the search strategy encounters a first additional node of the plurality of additional nodes instead of looking up the connectivity in a data structure, wherein
the connectivity for the viable routing solution does not alter the normal connectivity including the route; and
the act of generating the one or more additional routes is performed without disturbing the normal connectivity that includes a plurality of Steiner points and the route.

* * * * *